(12) United States Patent
Sekimoto

(10) Patent No.: US 9,000,475 B2
(45) Date of Patent: Apr. 7, 2015

(54) LIGHT-EMITTER AND TRANSISTOR

(71) Applicant: Panasonic Corporation, Osaka (JP)

(72) Inventor: Yasuhiro Sekimoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 220 days.

(21) Appl. No.: 13/778,570

(22) Filed: Feb. 27, 2013

(65) Prior Publication Data

US 2013/0320388 A1 Dec. 5, 2013

Related U.S. Application Data

(63) Continuation of application No. PCT/JP2012/003617, filed on May 31, 2012.

(51) Int. Cl.
*H01L 33/00* (2010.01)
*H01L 51/52* (2006.01)
*H01L 51/05* (2006.01)

(52) U.S. Cl.
CPC ............ *H01L 51/52* (2013.01); *H01L 51/0512* (2013.01)

(58) Field of Classification Search
CPC ...................................................... H01L 51/52
USPC ............. 257/13, 79, 82, 94, 98, 99, 100, 102, 257/103, 288, E33.001
See application file for complete search history.

(56) References Cited

U.S. PATENT DOCUMENTS

| | | | |
|---|---|---|---|
| 5,443,922 A | 8/1995 | Nishizaki et al. | |
| 6,333,501 B1 * | 12/2001 | Labrenz | 250/341.5 |
| 2003/0035972 A1 * | 2/2003 | Hanson et al. | 428/480 |
| 2004/0160187 A1 | 8/2004 | Yao | |
| 2005/0287392 A1 | 12/2005 | Toyoda | |
| 2007/0200491 A1 | 8/2007 | Seo et al. | |
| 2008/0183232 A1 * | 7/2008 | Voss et al. | 607/24 |
| 2010/0129852 A1 * | 5/2010 | Putnam et al. | 435/29 |
| 2013/0126841 A1 * | 5/2013 | Nishiyama et al. | 257/40 |

FOREIGN PATENT DOCUMENTS

| | | |
|---|---|---|
| JP | 5-163488 | 6/1993 |
| JP | 2004-272199 | 9/2004 |
| JP | 2006-004743 | 1/2006 |
| JP | 2006/013139 | 1/2006 |
| JP | 2008-084740 | 4/2008 |
| JP | 2010-161070 | 7/2010 |
| JP | 2011-034985 | 2/2011 |

* cited by examiner

*Primary Examiner* — Cuong Q Nguyen
*Assistant Examiner* — Yosef Gebreyesus
(74) *Attorney, Agent, or Firm* — Greenblum & Bernstein, P.L.C.

(57) ABSTRACT

A light-emitter with a bank having an upper surface located at a height of h0 with reference to the top surface of the base layer and a circumferential surface facing the aperture in the bank. When h denotes a height of a given point on the circumferential surface with reference to the top surface and x denotes a distance, measured in a direction along the top surface, of the given point from a boundary between the upper and circumferential surface, a second-order derivative of h with respect to x is continuous at a point corresponding to the boundary, h being smaller than h0. An inflection point of the second-order derivative is located at a height of 0.9h0 or greater with reference to the top surface, and a top surface of the functional layer is in contact with the circumferential surface at a contact point near the inflection point.

12 Claims, 23 Drawing Sheets

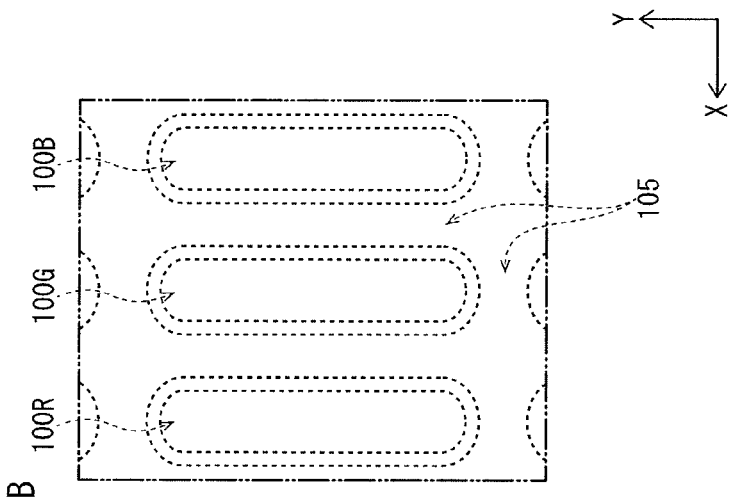
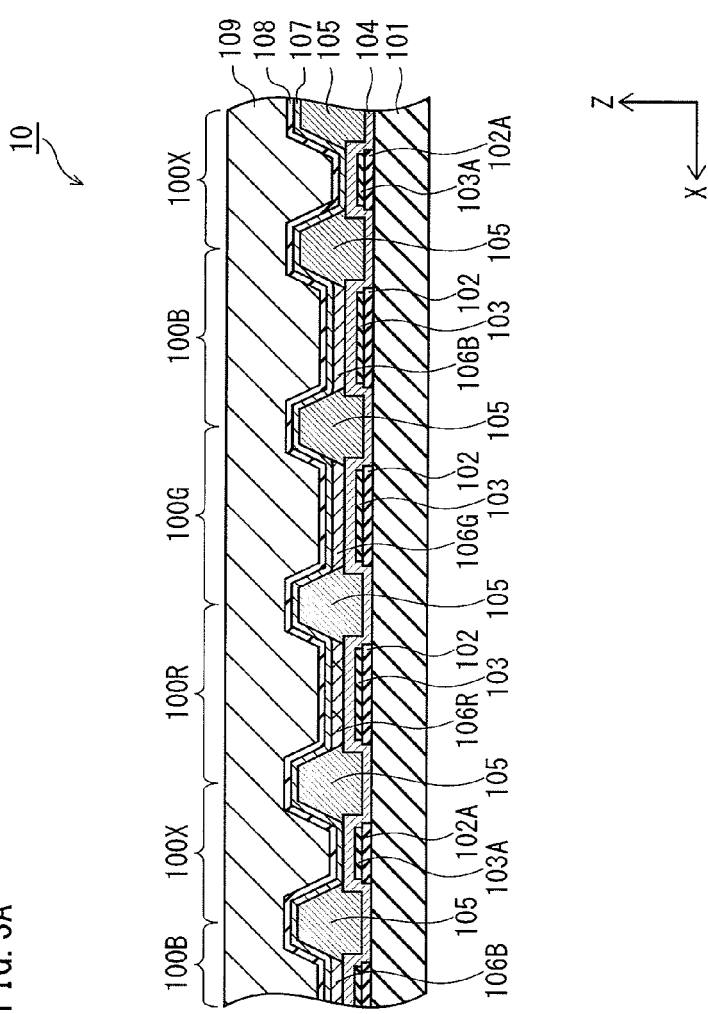

CCR mode ⟷ CCA mode

FIG. 17

| Test sample | 1 | 2 | 3 | 4 | 5 |
|---|---|---|---|---|---|
| Bank material | A | B | C | D | D |
| Ink viscosity [mPa·s] | 3.8 | 3.8 | 3.8 | 3.8 | 12.7 |
| h0[μm] | 0.92 | 1.06 | 1.01 | 0.98 | 0.98 |
| h[μm] | 0.55 | 0.95 | 0.95 | 0.88 | 0.88 |
| h/h0 | 0.60 | 0.93 | 0.98 | 0.90 | 0.90 |
| Δx[μm] | 1.23 | 0.44 | 0.26 | 0 | 0 |
| Δy[μm] | 0.22 | 0.040 | 0.038 | 0 | 0 |
| Insufficient wetting | × | ○ | ○ | ○ | ○ |

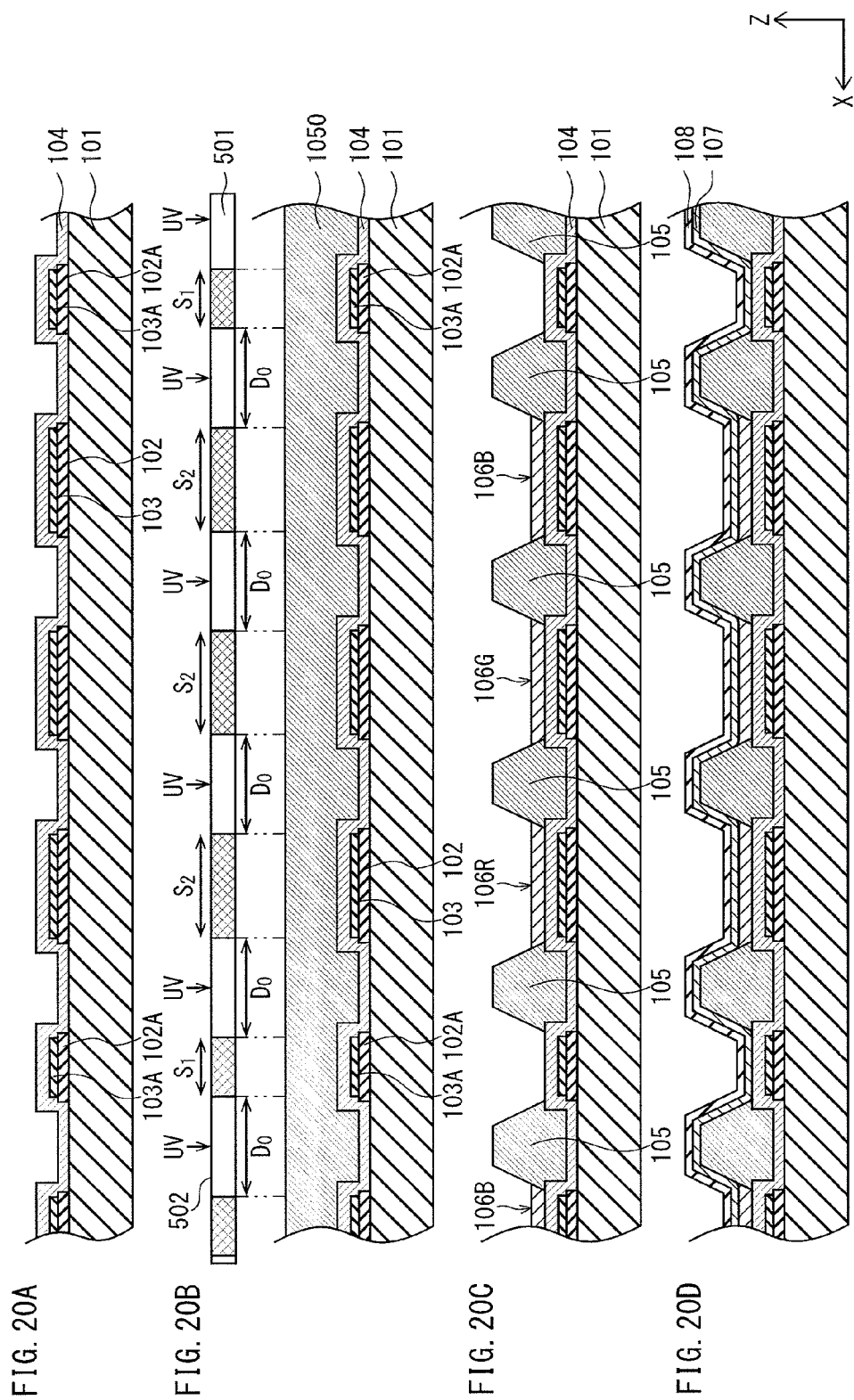

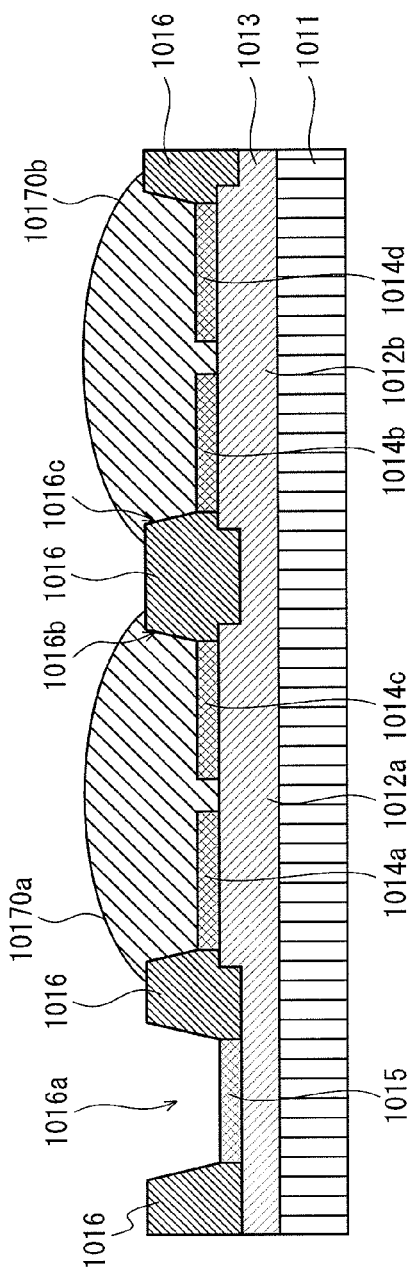
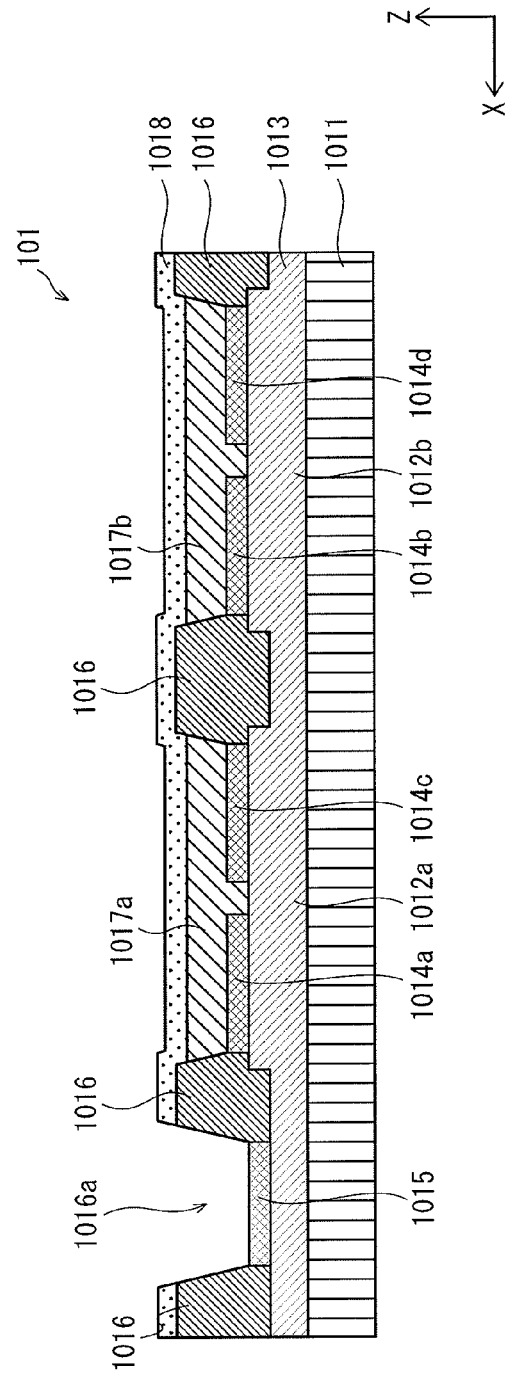
FIG. 23A
FIG. 23B

LIGHT-EMITTER AND TRANSISTOR

CROSS REFERENCE TO RELATED APPLICATION

This is a continuation application of PCT Application No. PCT/JP2012/003617 filed May 31, 2012, designating the United States of America, the disclosure of which, including the specification, drawings and claims, is incorporated herein by reference in its entirety.

TECHNICAL FIELD

The present disclosure relates to light-emitters and transistors.

DESCRIPTION OF THE RELATED ART

An organic display element, which is an example of a light-emitter, is made up of an anode, a cathode, and an organic functional layer which contains mainly an organic light-emitting layer located between the electrodes. As a material of the organic functional layer, a low-molecular organic compound or a high-molecular organic compound is used, for example.

As a light-emitter for a display panel, the organic display element has some advantageous features. For example, since the organic display element is formed from a thin film that contains an organic light-emitting layer having a thickness no greater than 1 μm, it can be driven with a low voltage. Also, since the organic display element is self-luminous, the power consumption can be low. The organic functional layer made of an organic compound can be formed by a coating method including an inkjet method.

When the organic functional layer is formed by a coating method, it is necessary to prevent ink to be applied to one pixel from entering its adjacent pixel that should emit light of a different color. There is a well-known method that meets the necessity and can be used in the case of the inkjet method for example. According to this method, banks are formed on the surface where ink containing the organic functional material is to be applied, and drops of the ink are ejected in the areas partitioned by the banks (See Patent Literature 1, for example).

Such banks are formed with photolithography, for example. The method of forming the banks by photolithography includes a step of forming a photosensitive resin film, a step of patterning the resin film by exposure and development, and a step of baking the resin film that has been developed. The banks may be made of a material containing resin with high liquid-repellency (e.g. resin containing fluorine) in order to improve the function of holding the drops of ink.

CITATION LIST

Patent Literature

[Patent Literature 1] Japanese Patent Application Publication No. 2006-004743

SUMMARY

However, "insufficient wetting" occasionally occurs. This is a phenomenon in which the ink does not wet the entire area partitioned by the banks and a portion of the area is not provided with the organic film. In the case of the inkjet method, it is important that the banks hold the ink, and the liquid-repellency of the banks is therefore desired to be high. However, the risk of the insufficient wetting increases with increased liquid-repellency. The insufficient wetting can be a cause of short circuit between the anode and the cathode, which degrades the display quality of the organic display element.

Considering the above problems, the present disclosure aims to provide a light-emitter with a low risk of the insufficient wetting with high process stability.

To achieve the aim, one aspect of the present invention provides a light-emitter comprising: a base layer including a first electrode; a bank defining an aperture on the base layer, the aperture having a major axis and a minor axis in plan view; a functional layer located within the aperture and in contact with a top surface of the base layer; and a second electrode corresponding in position to the first electrode with the functional layer interposed therebetween, wherein in a cross-section passing through the major axis of the aperture in a perpendicular direction to the top surface of the base layer, the bank has an upper surface located at a height of h0, with reference to the top surface of the base layer, and a circumferential surface facing the aperture, when h denotes a height of a given point on the circumferential surface with reference to the top surface of the base layer, and x denotes a distance, measured in a direction along the top surface, of the given point from a boundary between the upper surface and the circumferential surface of the bank, a second-order derivative of h with respect to x is continuous at a point corresponding to the boundary, h being smaller than h0, an inflection point of the second-order derivative, at which the second-order derivative changes from approximately 0 to a negative value, is located at a height of 0.9h0 or greater with reference to the top surface of the base layer, and a top surface of the functional layer is in contact with the circumferential surface at a contact point near the inflection point.

The light-emitter pertaining to one aspect of the present invention prevents the occurrence of the insufficient wetting in the apertures partitioned by the banks.

These general, and specific aspects may be implemented using a manufacturing method.

BRIEF DESCRIPTION OF DRAWINGS

FIG. 3A is a partial cross-sectional view of a display panel 10, and FIG. 3B is a front view of the display panel 10.

FIG. 17 is a table summarizing the results of Tests 1 through 5.

FIGS. 20A through 20D show processes of manufacturing an organic EL display panel.

FIGS. 23A and 23B show processes of manufacturing a thin film transistor.

DETAILED DESCRIPTION

Figure 1:
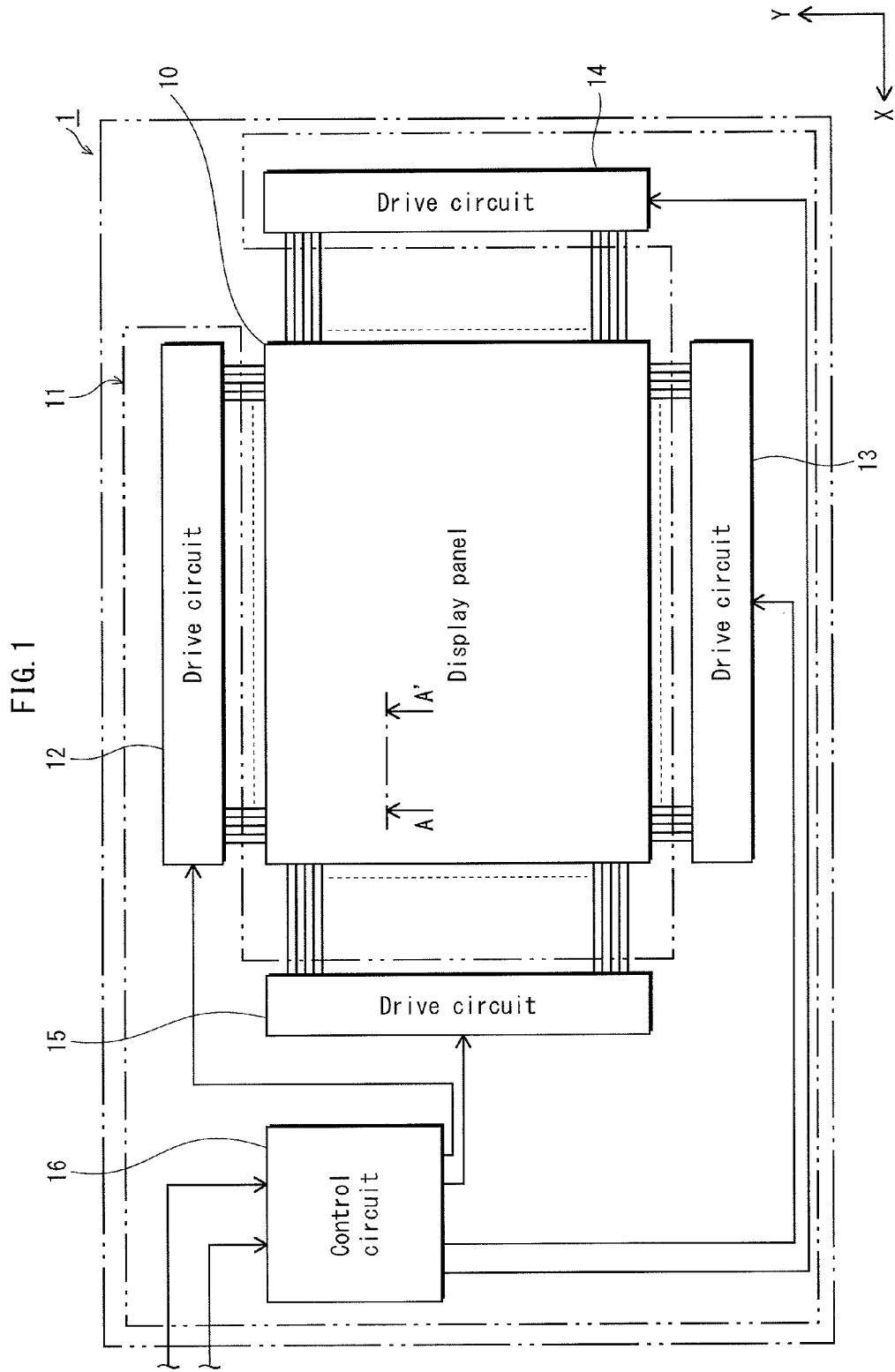
FIG. 1 is a block diagram showing an overall structure of an organic EL device 1 pertaining to Embodiment 1.

Outline of an Aspect of the Present Invention

One aspect of the present invention is a light-emitter comprising: a base layer including a first electrode; a bank defining an aperture on the base layer, the aperture having a major axis and a minor axis in plan view; a functional layer located within the aperture and in contact with a top surface of the base layer; and a second electrode corresponding in position to the first electrode with the functional layer interposed therebetween, wherein in a cross-section passing through the major axis of the aperture in a perpendicular direction to the top surface of the base layer, the bank has an upper surface located at a height of h0, with reference to the top surface of the base layer, and a circumferential surface facing the aperture, when h denotes a height of a given point on the circumferential surface with reference to the top surface of the base layer, and x denotes a distance, measured in a direction along the top surface, of the given point from a boundary between the upper surface and the circumferential surface of the bank, a second-order derivative of h with respect to x is continuous at a point corresponding to the boundary, h being smaller than h0, an inflection point of the second-order derivative, at which the second-order derivative changes from approximately 0 to a negative value, is located at a height of 0.9h0 or greater with reference to the top surface of the base layer, and a top surface of the functional layer is in contact with the circumferential surface at a contact point near the inflection point.

The inflection point may be located at a height of 0.93h0 or greater with reference to the top surface of the base layer.

In the cross-section passing through the major axis of the aperture in the perpendicular direction to the top surface of the base layer, the contact point of the top surface of the functional layer and the circumferential surface may be located below the inflection point, and a distance of the contact point from the inflection point in the perpendicular direction may be no greater than 40 nm.

In the cross-section passing through the major axis of the aperture in the perpendicular direction to the top surface of the base layer, the contact point of the upper surface of the functional layer and the circumferential surface may be farther from the upper surface of the bank than the infection point is, and a distance of the contact point from the inflection point in a direction along the major axis of the aperture may be no greater than 440 nm.

The functional layer may be formed by a coating method.

The second-order derivative may be continuous from the boundary between the upper surface and the circumferential surface of the bank to a boundary between the top surface of the base layer and the circumferential surface.

Another aspect of the present invention is a transistor comprising: a bank defining an aperture having a major axis and a minor axis in plan view; a gate electrode located below or above the aperture; a gate insulation film located closer to the aperture than the gate electrode is; a base layer located below the bank and having a source electrode and a drain electrode, at least a portion of the source electrode and a portion of the drain electrode being located within the aperture; and a semiconductor layer located within the aperture and in contact with the base layer, the semiconductor layer corresponding in position to the gate electrode with the gate insulation film interposed therebetween wherein in a cross-section passing through the major axis of the aperture in a perpendicular direction to the top surface of the base layer, the bank has an upper surface located at a height of h0 with reference to the top surface of the base layer, and a circumferential surface facing the aperture, when h denotes a height of a given point on the circumferential surface with reference to the top surface of the base layer, and x denotes a distance, measured in a direction along the top surface, of the given point from a boundary between the upper surface and the circumferential surface of the bank, a second-order derivative of h with respect to x is continuous at a point corresponding to the boundary, h being smaller than h0, an inflection point of the second-order derivative, at which the second-order derivative changes from approximately 0 to a negative value, is located at a height of 0.9h0 or greater with reference to the top surface of the base layer, and a top surface of the functional layer is in contact with the circumferential surface at a contact point near the inflection point.

The inflection point may be located at a height of 0.93h0 or greater with reference to the top surface of the base layer.

In the cross-section passing through the major axis of the aperture in the perpendicular direction to the top surface of the base layer, the contact point of the top surface of the functional layer and the circumferential surface may be located below the inflection point, and a distance of the contact point from the inflection point in the perpendicular direction may be no greater than 40 nm.

In the cross-section passing through the major axis of the aperture in the perpendicular direction to the top surface of the base layer, the contact point of the upper surface of the functional layer and the circumferential surface may be farther from the upper surface of the bank than the infection point is, and a distance of the contact point from the inflection point in a direction along the major axis of the aperture may be no greater than 440 nm.

The functional layer may be formed by a coating method.

The second-order derivative may be continuous from the boundary between the upper surface and the circumferential surface of the bank to a boundary between the top surface of the base layer and the circumferential surface.

The following describes light-emitters and transistors pertaining to the present disclosure based on embodiments. Note that each of the embodiments described below is a preferable example of the present invention. Any numeric values, shapes, materials, constituent elements, locations of the constituent elements, connection configurations, manufacturing steps and the order of the steps referred to in the description of the embodiments are merely examples, and they are not intended to limit the present invention. The present invention is limited by CLAIMS only. Therefore, among the constituent elements of the embodiments, those not recited in the independent claims are not essential for solving the problems. They may be used for embodying the present invention in a preferable form. Also note that the drawings are schematic and hence not necessarily faithful.

Embodiment 1

Organic EL Device

FIG. 1 is a block diagram showing an overall structure of an organic EL device 1 pertaining to Embodiment 1.

The organic EL device 1 includes an organic EL display panel 10 and a drive control unit 11 connected thereto.

The organic EL display panel 10 is composed of a plurality of organic EL elements (light-emitters) arranged along the X direction and the Y direction that intersects (at right angles in the example) with each other so as to form a matrix.

The drive control unit 11 includes four drive circuits 12-15 and a control circuit 16, for example. The number of the drive circuits may be other than four.

Figure 2:
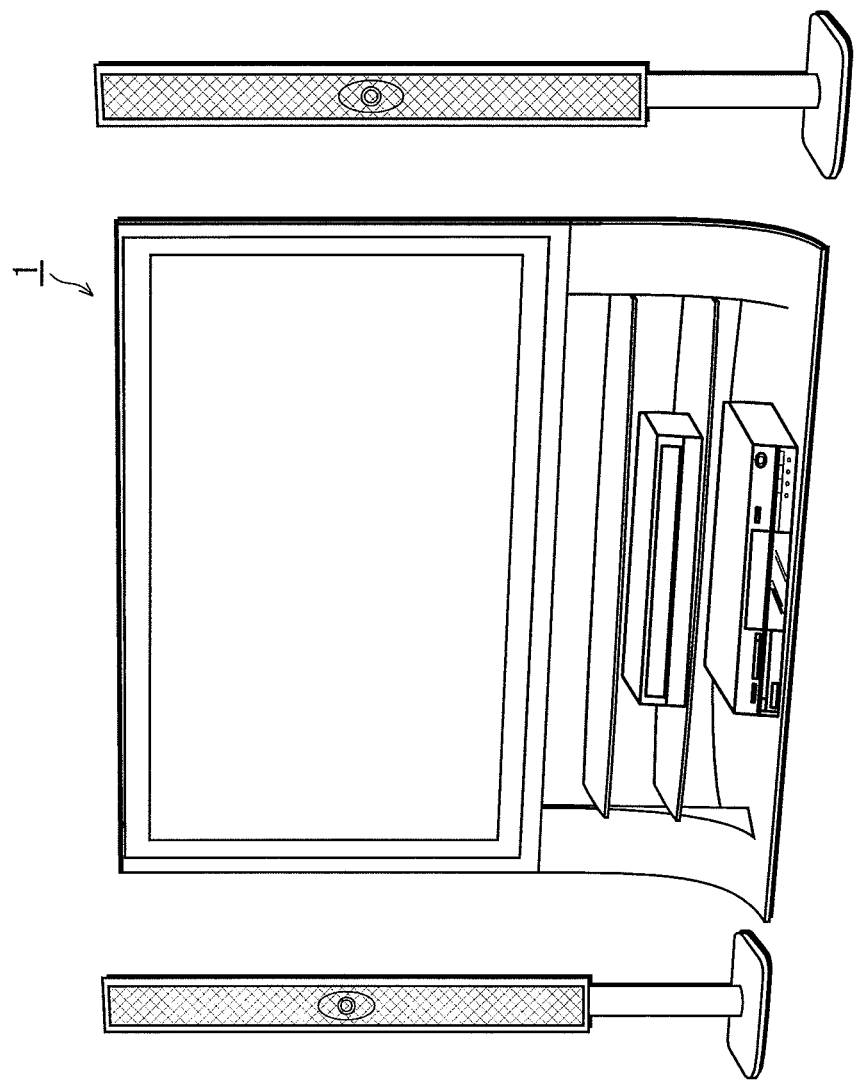
FIG. 2 is an external perspective view showing an example of the appearance of a set that includes the organic EL device 1.

The organic EL device 1 may be combined with an audio device and used as part of a television system as shown in FIG. 2. The organic EL device 1 can be thin because it does not require back light unlike liquid crystal displays (LCDs), and is advantageous in terms of system designing.

Organic EL Display Panel 10

FIG. 3A is a partial cross-sectional view of the organic EL display panel 10, which shows basic structures of organic EL elements 100R, 100G, 100B. This drawing shows a cross-sectional view of the organic EL display panel 10 along the arrows A and A' shown in FIG. 1. FIG. 3B is a partial frontal view of the organic EL display panel 10.

As shown in FIG. 3B, in the organic EL display panel 10, the organic EL elements 100R for red (R) light, the organic EL elements 100G for green (G) light and the organic EL elements 100B for blue light (B) are arranged repeatedly in the X direction in the light-emitting areas partitioned by the banks 105. In the organic EL display panel 10, each of the elements 100R, 100G and 100B constitutes a light-emitting area as a sub pixel, and each group of adjacent three organic EL elements 100R, 100G and 100B constitutes a pixel. A busbar 100X is provided between adjacent pixels arranged in the X direction, and each busbar 100X extends in the Y direction.

As shown in FIG. 3A, the organic EL display panel 10 includes a TFT substrate 101 (hereinafter simply referred to as "the substrate 101") and an anode (a first electrode) 102, an electrode coating layer 103 and a hole injection layer 104 which are layered on the upper surface of the substrate 101 in the stated order. On the hole-injection layer 104, one of organic light-emitting layers 106R, 106G or 106B, an electron transport layer 107, a cathode (a second electrode) 108 and a passivation layer 109 are layered in the stated order.

Among the above, the anode 102, the electrode coating layer 103 and the organic light-emitting layers 106R, 106G and 106B are formed in each of the organic EL elements 100R, 100G or 100B. On the other hand, the hole-injection layer 104, the electron transport layer 107, the cathode 108 and the passivation layer 109 are uniformly formed on the upper surface of the substrate 101. The organic EL elements 100R, 100G and 100B are explained as top-emission type elements, for example.

In each busbar area 100X, an auxiliary electrode 102A and an electrode coating layer 103A is layered in the stated order.

The following explains each of the constituent elements.

Substrate 101

The substrate 101 serves as a base of the organic EL display panel 10, and includes a substrate body 1011, which will be described in the description of Embodiment 2, and a TFT wiring portion (omitted from the drawings) formed on the substrate body 1011. The substrate body 1011 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

The TFT wiring portion is formed to include wiring for driving the organic EL elements 100R, 100G and 100B in an active matrix driving method (i.e. wiring including thin film transistors such as a driving TFT and a switching TFT, power source lines, signal lines, etc.). Note that the surface of the TFT wiring portion is coated with an interlayer insulation film (e.g. planarizing film) which is omitted from the drawings.

Anode 102

The anode 102 includes a single layer of conductive material or a layered body formed from a plurality of layers. The anode 102 is formed with Ag (silver), APC (alloy of silver, palladium, and copper), ARA (alloy of silver, rubidium, and gold), MoCr (alloy of molybdenum and chromium), NiCr (alloy of nickel and chromium), or the like. The anode 102 is electrically connected to the gate/drain electrodes of the TFT included in the TFT wiring portion, via the contact holes (omitted from the drawings) passing through the interlayer insulation film described above.

When the organic EL display panel 10 is of the top-emission type, it is desirable that the anode 102 is made of highly reflective material.

Electrode Coating Layer 103

The electrode coating layer 103 is made of ITO (indium tin oxide) for example, and is disposed to cover the upper surface of the anode 102.

Hole Injection Layer 104

The hole injection layer 104 is a layer of an oxide such as silver (Ag), molybdenum (Mo), chromium (Cr), vanadium (V), tungsten (W), nickel (Ni), iridium (Ir), etc. A hole injection layer 104 formed from such a metal oxide has the function of assisting with hole generation and of injecting and transporting holes stably into the organic light emitting layers 106R, 106G and 106B.

Note that in addition to forming the hole injection layer 104 with the above-described metal oxides, PEDOT (an amalgam of polythiophene and polystyrene sulfonic acid) or the like may also be used.

A hole transport layer may be formed between the hole-injection layer 104 and each of the organic light-emitting layers 106R, 106G and 106B.

Banks 105

The banks 105 are formed to have a pixel bank structure. That is, as shown in FIG. 3B, the banks 105 are formed on the surface of the hole injection layer 104 above the substrate 101 in the raw and column directions (i.e. X and Y directions) so as to be in a lattice shape. In plan view of the panel, a plurality of apertures (ink application areas 101R, 101G and 101B, for example) are formed side by side by the banks 105 as shown in FIG. 3A. Thus, the banks 105 define each of the organic EL elements 100R, 100G and 100B for different light colors and the busbar areas 100X.

The material of the banks 105 is not limited to any particular material. However, it is desirable that the banks 105 are made of an organic material with insulating properties (such as acrylic resin, polyimide resin, novolac-type phenolic resin, and the like). Since the etching process, the baking process and so on are performed in the manufacturing, it is desirable that a material with high resistance is used so that the banks are not notably deformed or deteriorated during the processes. To stably hold applied ink, it is desirable that the banks are liquid-repellent. For example, fluorine treatment may be applied to the banks to make the banks liquid-repellent.

The bank 105 may have a multilayer structure including two or more layers, instead of the single-layer structure shown in FIG. 3A. If this is the case, the banks may be formed by laminating organic material layers, inorganic material layers, or a combination of organic and inorganic material layers.

Organic Light-Emitting Layers 106R, 106G and 106B

The organic light-emitting layers 106R, 106G and 106B are a sort of functional layers pertaining to the present disclosure. Each of the organic light-emitting layers 106R, 106G and 106B has a function to emit light when voltage is applied thereto, by re-combining the holes injected from the anode 102 and the electrons injected from the cathode 108 and thereby causing excitation. The organic light-emitting layers 106 are formed according to a wet process. That is, they are formed by applying ink containing functional material (light-emitting organic material) above the anode 102, and drying the ink.

Examples of such light-emitting organic material include fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

Electron Transport Layer 107

The electron transport layer 107 has a function of efficiently transporting electrons injected from the cathode 108 to the organic light-emitting layers 106R, 106G and 106B. For example, barium, phthalocyanine, lithium fluoride, or a combination thereof may be used.

Cathode 108

The cathode 108 is formed, for example, of ITO, indium zinc oxide (IZO), etc. In the case of the top-emission type organic EL display panel 10, it is preferable that the cathode 108 be formed with a transparent material. It is preferable that the degree of transparency be 80% or greater.

Alternatively, the cathode 108 may be formed with an alkaline metal or an alkaline earth metal, or may be formed by stacking a layer containing halides thereof and a layer containing sliver, in this order. The layer containing silver may be formed from silver alone or a silver alloy. Also, in order to increase light takeoff efficiency, a highly transparent refraction index adjustment layer may be provided above the layer that includes silver.

Passivation Layer 109

The passivation layer 109 has the function of controlling the organic light-emitting layer 106 or other layers from being exposed to water or air and is formed, for example, with silicon nitride (SiN), silicon oxynitride (SiON), etc. In the case of the top-emission type organic EL display panel 10, it is preferable that the cathode 108 be formed with a transparent material.

Busbar Areas 100X

Each busbar area 100X is provided between the element 100B and the element 100R of adjacent pixels. The busbars are used for securing excellent conductivity of the cathode 108 in all the elements 100R, 100G and 100B of the organic EL display panel 10. The cathode 108 is electrically connected to the busbar (auxiliary electrode 102A) with the electrode coating layer 103A interposed therebetween.

The location of the busbar areas 100X is not limited. For example, the busbar areas 100X may be provided in the X direction one for a group of pixels or one for each sub pixel. Alternatively, the busbar areas 100X may be provided one for several tens of elements.

In the example above, the organic EL display panel is explained as a bottom emission type panel which emits light from the side closer to the bottom electrode (the anode 102). However, the panel may be a top emission type panel which emits light from the side closer to the top electrode (the cathode 108).

<Shape of Apertures>

Figure 4:
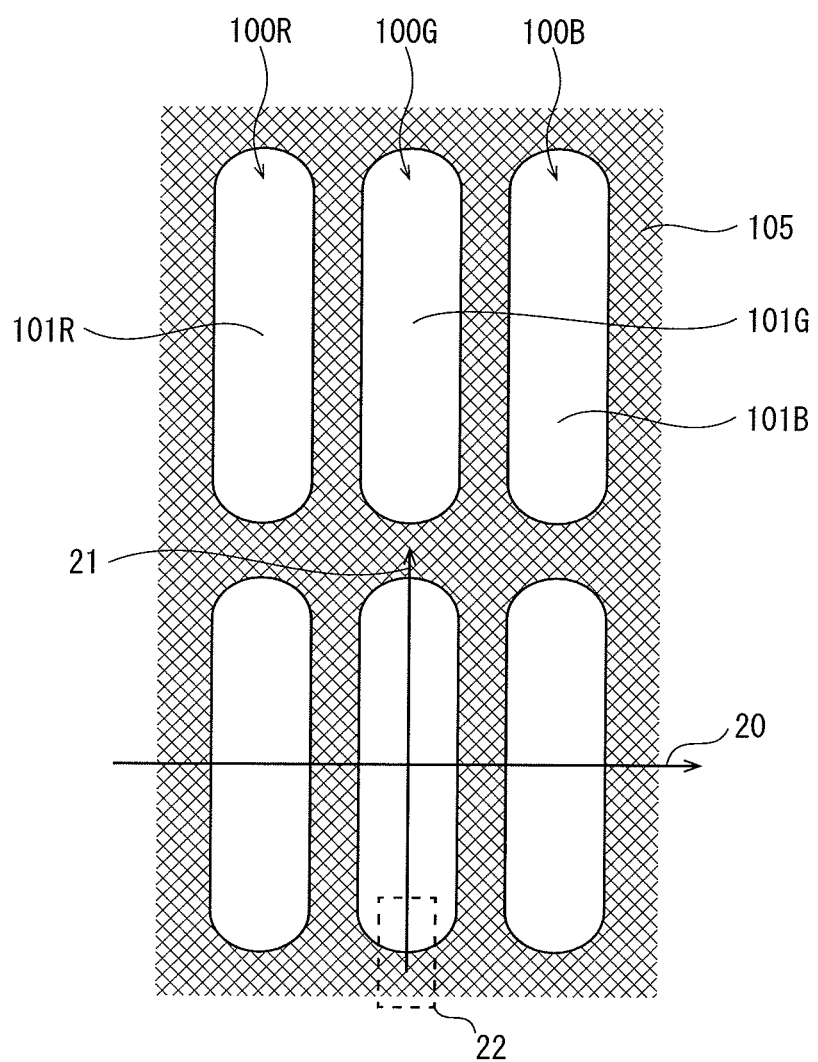
FIG. 4 is an overhead view of ink application areas and upper surfaces of banks.

FIG. 4 is an overhead view of the plurality of apertures (ink application areas 101R, 101G and 101B) in the organic EL display panel pertaining to the present disclosure. As explained with reference to FIG. 3, the ink application areas 101R, 101G and 101B of the organic EL elements 100R, 100G and 100B are partitioned by the banks 105. Although the shape of the pixels and the size of the apertures can be arbitrary determined, it is desirable that the edge of each pixel is curved like an arc, in order to allow the ink to easily spread. Note in the following description that the shorter axis 20 of each of the ink application areas 101R, 101G and 101B, which is the axis in the width direction thereof, is referred to as "the minor axis", and the longer axis 21 thereof, which is the axis in the length direction thereof, is referred to as "the major axis". However, when the length and the width are the same, either one of the axes can be considered as the minor axis or the major axis. The banks 105 are formed on a base layer 110, and define each aperture in a forward tapered shape so that the diameter at the top is larger than at the bottom.

The following explains the apertures in the tapered shape.

Figure 5B:
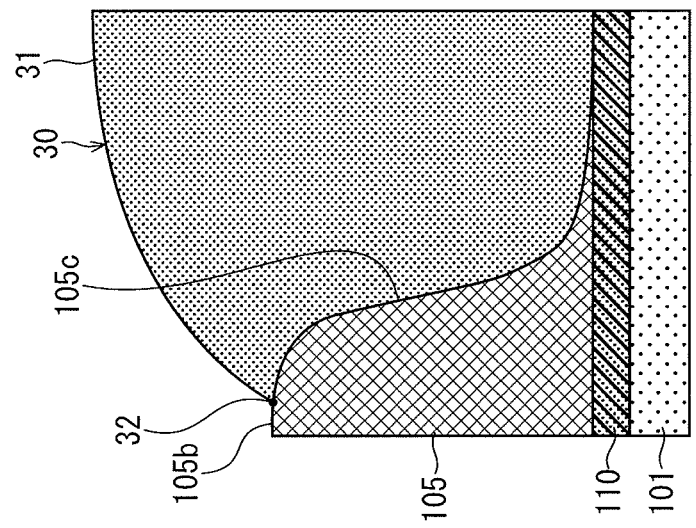
FIG. 5B is a schematic diagram showing conditions immediately after application of ink to an ink application area.
Figure 5A:
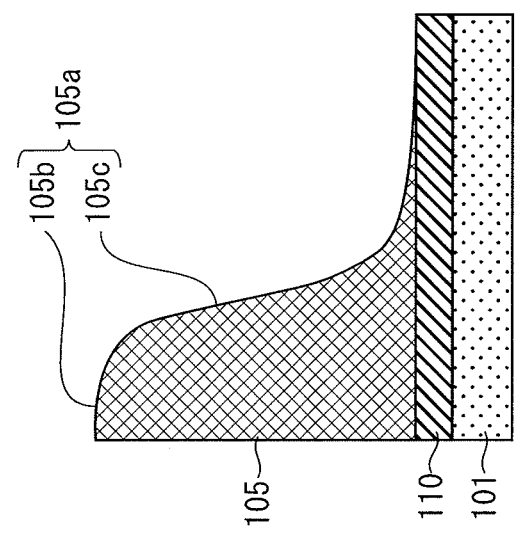
FIG. 5A is a schematic diagram showing the shape of a side surface of a bank.

FIG. 5A is a cross-sectional view of the area 22 of the organic EL apparatus 1 shown in FIG. 4, along the plane that is perpendicular to the upper surface of the substrate 101 and includes the major axis. The organic light-emitting layers 106R, 106G and 106B, the electron transport layer 107 and the cathode 108 are omitted from this drawing. The base layer 110 is formed on the substrate 101 by layering the interlayer insulation film, the anode 102, the electrode coating layer 103 and the hole injection layer 104. The banks 105 are formed on the base layer 110. Note that the base layer 110 is not necessarily formed by layering the interlayer insulation film, the anode 102, the electrode coating layer 103 and the hole injection layer 104, and may be formed from some of the stated layers, or another layer may be included in addition to some or all of the stated layers.

FIG. 5B shows conditions after spraying ink by the inkjet method in the aperture having the cross-section shown in FIG. 5A. The ink drops 30 dripped into the ink application areas 101R, 101G and 101B are held within the apertures due to the repellency of the banks 105.

The ink drop 30 in the aperture dries over time (i.e. the solvent contained in the ink drop 30 evaporates) and reduces in volume. Accordingly, the boundary 32 between the top surface 31 of the ink drop 30 and the circumferential surface 105c surrounding the aperture (i.e. the part at which the upper surface 31 of the ink drop 30, dripped onto the ink application area 101R, 101G or 101B, contacts with the surface 105a of the bank 105) gradually recedes from the upper surface 105b of the bank 105 to the circumferential surface 105c surrounding the aperture, and, after a while, further recedes toward the base layer 110 along the circumferential surface 105c.

The process of the recession of the boundary 32 greatly depends on the state of the surface 105a of the bank 105, and occasionally the "insufficient wetting" occurs. Several factors can be considered as the cause of the insufficient wetting. For example, when the bank is made up of a liquid-repellent resin, a residue of the liquid-repellent resin might remain on the surface of the ink dripping area after the development or the bank surface processing. If a liquid-repellent residue generated after the photolithography remains on the surface 105a of the bank 105, for example, the residue repels the ink drop 30 and causes the insufficient wetting in some cases. The insufficient wetting can be a factor of a failure in forming the organic light-emitting layers 106R, 106G and 106B, and might cause short circuit between the electrodes 102 and 108.

In the case where the inkjet method is used for forming the organic light-emitting layers 106R, 106G and 106B, the shape of the circumferential surface 105c of the bank 105 has a significant influence on the film shape of the organic light-emitting layers 106R, 106G and 106B, and hence the process of the recession of the boundary 32 directly affects the film shape.

Therefore, controlling the recession of the boundary 32 on the bank 105 plays a very important role in forming the organic light-emitting layers 106R, 106G and 106B by the inkjet method. In order to prevent the insufficient wetting and realize a stable film shape, it is desirable to suppress the recession of the boundary 32 and hold the ink drop 30 (hereinafter referred to as "pinning") at a relatively high position on the circumferential surface 105c of the bank 105.

FIGS. 6 through 10 schematically show the process of the recession of the boundary 32. The process of drying the ink drop 30 includes Constant Contact Angle (CCA) mode and a Constant Contact Radius (CCR) mode. In the CCA mode, the boundary 32 recedes as the volume of the ink drop 30 decreases. In the CCR mode, the boundary 32 does not recedes as the volume of the ink drop 30 decreases and the height of the ink drop 30 decreases instead.

Figure 6:
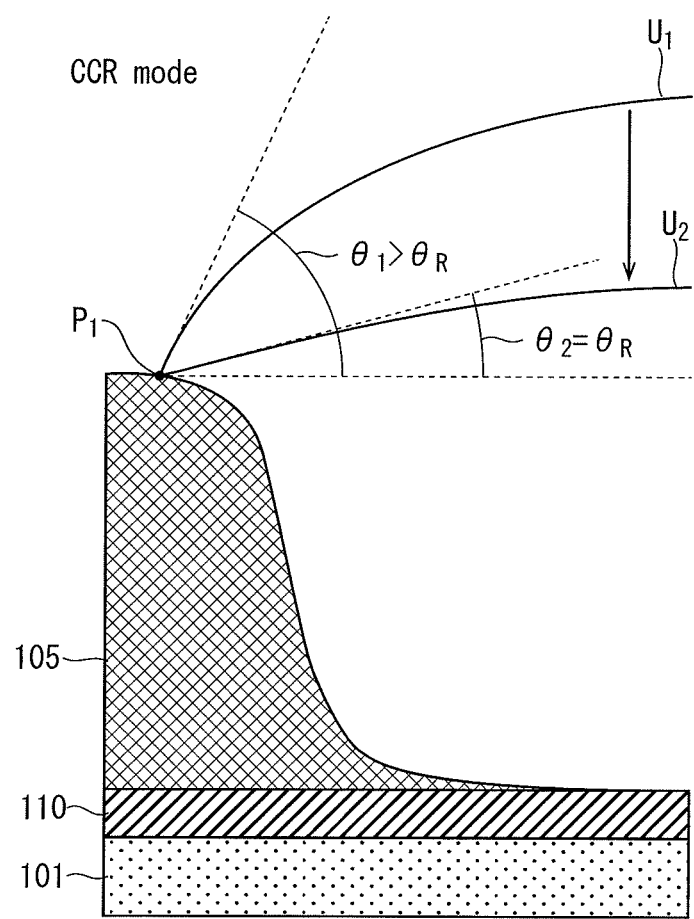
FIG. 6 is a first schematic diagram showing a mechanism of recession of an edge of an ink drop near a bank slope.

Immediately after being applied, the ink drop 30 dries in the CCR mode. In the CCR mode, as shown in FIG. 6, the boundary 32 remains at the point $P_1$, and the height of the ink drop 30 decreases. As the height of the ink drop 30 decreases, the angle formed by the surface 105a of the bank 105 and the upper surface 31 of the ink drop 30 decreases. This angle is called "the contact angle" of the ink drop 30. For example, when the height of the ink drop 30 decreases and the upper surface 31 of the ink 30 recedes from the point $U_1$ to the point $U_2$, the contact angle $\theta_1$, which is greater than a recession contact angle $\theta_R$, decreases to the contact angle $\theta_2$, which is equal to the recession contact angle $\theta_R$. As described above, the ink drop 30 dries in the CCR mode until the upper surface 31 of the ink drop 30 recedes to the point $U_2$.

Figure 7:
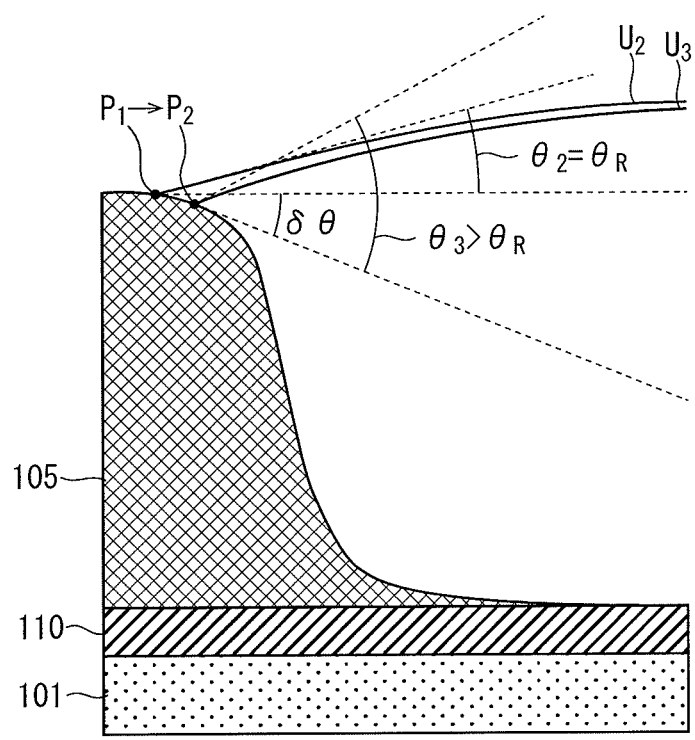
FIG. 7 is a second schematic diagram showing a mechanism of recession of an edge of an ink drop near a bank slope.

From the time the contact angle $\theta_2$ becomes equal to the recession contact angle $\theta_R$, the ink drop 30 dries in the CCA mode. In the CCA mode, the boundary 32 moves. When the ink 30 is located on a flat surface, the contact angle is kept at the recession contact angle $\theta_R$ even though the boundary 32 recedes. However, when the ink 30 is located on a slope such as the circumferential surface 105c, the contact angle increases by $\delta\theta$ as the boundary 32 recedes as shown in FIG. 7, due to the increase in inclination angle of the circumferential surface 105c. For example, when the boundary 32 recedes from the point $P_1$ to the point $P_2$ and the upper surface 31 of the ink drop 30 recedes from the point $U_2$ to the $U_3$, the contact angle $\theta 3$ becomes greater than the recession contact angle $\theta_R$. As described above, the ink drop 30 dries in the CCA mode until the upper surface 31 of the ink drop 30 recedes from the point $U_2$ to the point $U_3$.

Figure 8:
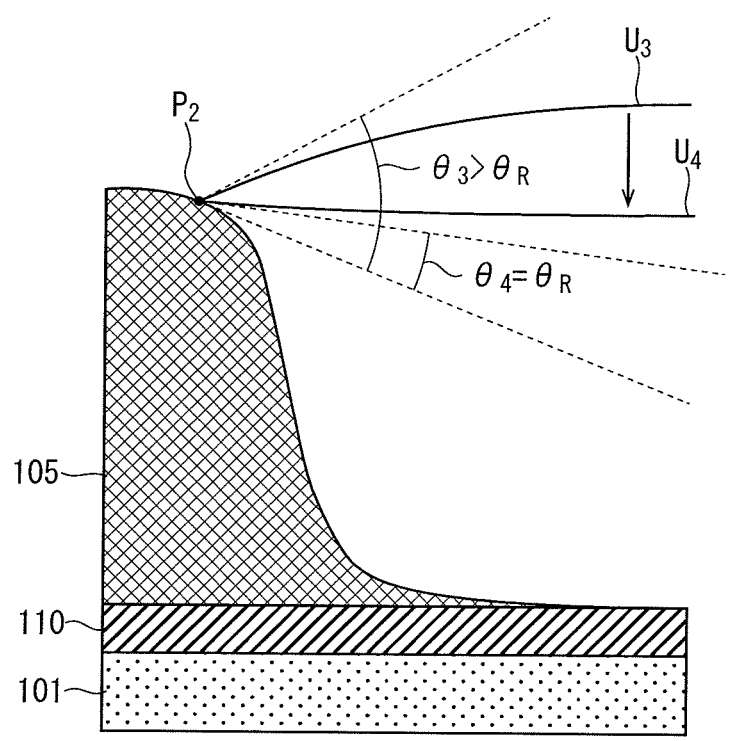
FIG. 8 is a third schematic diagram showing a mechanism of the lowering of an ink surface near a bank slope.

When the contact angle becomes greater than the recession contact angle $\theta_R$ again, the ink drop 30 starts drying in the CCR mode again. As shown in FIG. 8, in the CCR mode, the ink drop 30 continues drying with the boundary 32 staying at the point $P_2$, until the contact angle $\theta_3$ decreases to the recession contact angle $\theta_R$. Then, the upper surface 31 of the ink 30 recedes from the point $U_3$ to the point $U_4$, and the contact angle $\theta_4$ becomes equal to the recession contact angle $\theta_R$. As described above, the ink drop 30 dries in the CCR mode until the upper surface 31 of the ink drop 30 recedes from the point $U_3$ to the point $U_4$.

Figure 9:
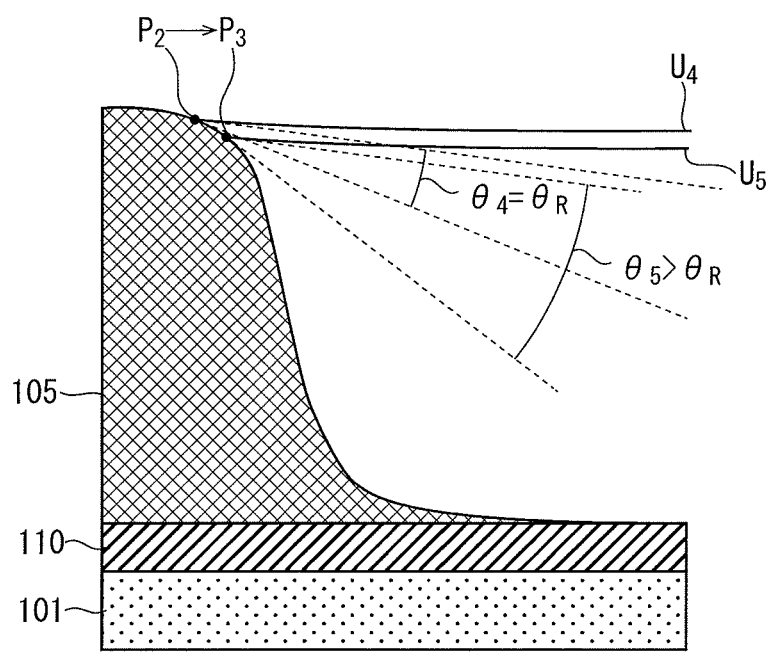
FIG. 9 is a fourth schematic diagram showing a mechanism of recession of an edge of an ink drop near a bank slope.

When the contact angle becomes equal to the recession contact angle $\theta_R$ again, the ink drop 30 starts drying in the CCA mode again. As shown in FIG. 9, in the CCA mode, the boundary 32 recedes from the point $P_2$ to the point $P_3$, the upper surface 31 of the ink drop 30 recedes from the point $U_4$ to the $U_5$, and then the contact angle $\theta_5$ exceeds the contact angle $\theta_R$ again. As described above, the ink drop 30 dries in the CCA mode until the upper surface 31 of the ink drop 30 recedes from the point $U_4$ to the point $U_5$.

Figure 10:
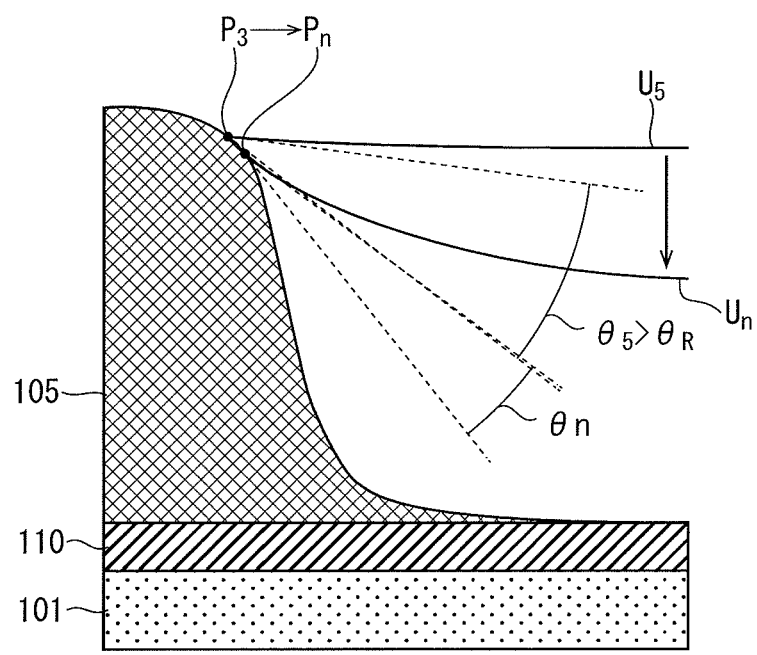
FIG. 10 is a fifth schematic diagram showing a mechanism of recession of an edge of an ink drop near a bank slope.

Thereafter, the boundary 32 continues receding while repeatedly switching between the CCA mode and the CCR mode as shown in FIG. 10. When the ink concentration near the boundary 32 reaches the critical concentration, the boundary 32 is fixed at the point $P_n$. Thus, the upper surface 31 of the ink drop 30 is fixed at the point $U_n$, and the pinning of the ink completes when the contact angle becomes $\theta_n$.

Considering the above mechanism, it can be concluded that when the proportion of drying in the CCA mode to the entire drying process of the ink drop 30 is greater, the boundary 32 recedes by a greater amount and the pinning point comes lower on the circumferential surface 105c of the bank 105. In order to keep the pinning point of the ink drop 30 high, it is necessary to facilitate the CCR mode drying and suppress the CCA mode drying. Therefore, even if the mode changes from the CCR mode as the initial mode to the CCA mode, it is necessary when the mode switches back to the CCR mode again to keep the CCR mode by preventing switching to the CCA mode.

Figure 11:
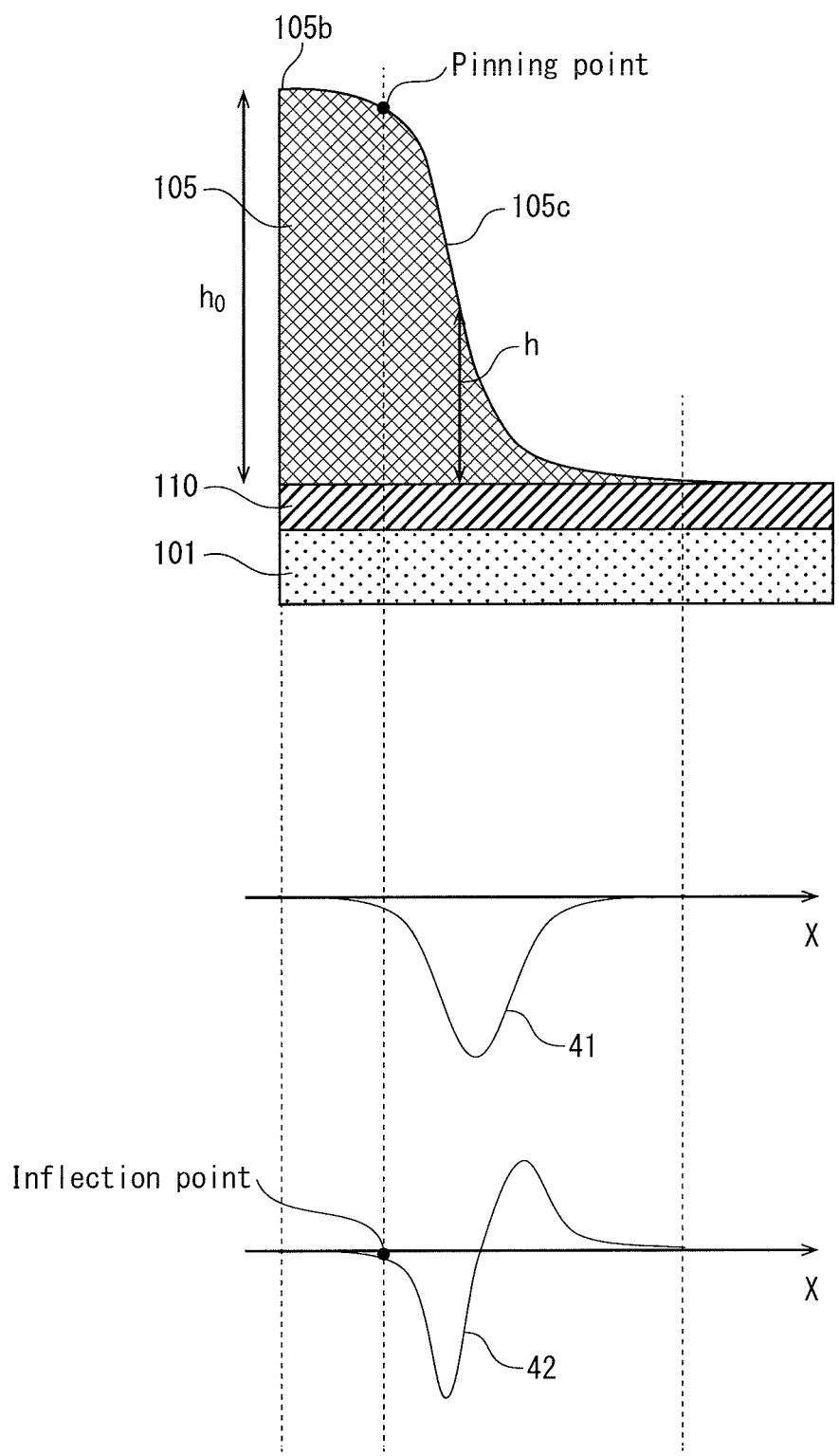
FIG. 11 shows a cross-section and a profile of a bank.

FIG. 11 schematically shows the cross-sectional shape of the bank 105. The sign h0 denotes the height of the bank 105, and the sign h denotes the height of a point on the circumferential surface 105c of the bank 105 with reference to the top surface of the base layer 110. The sign x denotes the distance from the boundary between the upper surface 105b and the circumferential surface 105c of the bank 105 measured in the major axis direction of the aperture. Note that the positive direction of the X axis (indicated by the arrow of the X axis shown in FIG. 11) is set as the direction in which the height of the bank 105 decreases (i.e. the direction from the top to the bottom of the forward tapered shape).

The graph 41 shows the first-order derivative obtained by differentiation of the height h of the bank 105 with respect to the distance x. In the graph 41, within the range where the absolute value of the first-order derivative is large, the angle formed by the tangent to the circumferential surface 105c of the bank 105 and the top surface of the base layer 110 is large.

The graph 42 shows the second-order derivative obtained by second-order differentiation of the height h of the bank 105 with respect to the distance x. The second-order derivative of the height h of the bank 105 shows the change (increase or decrease) 60 in the contact angle, which is the change in the inclination angle of the circumferential surface 105c of the bank 105. In the graph 42, a point at which the second-order derivative changes from approximately 0 to a negative value (hereinafter referred to as "an inflection point") shows that, at the point, the tapered shape of the aperture changes toward the direction in which the inclination angle of the surface 105a of the bank 105 increases (i.e. the direction in which the angle formed by the tangent to the circumferential surface 105c of the bank 105 and the top surface of the base layer 110 increases). It can be assumed that the CCR mode can be easily maintained at the point due to the increase in the inclination angle.

That is, the pinning point of the ink drop 30 can be set high on the circumferential surface 105c of the bank 105 by designing the shape of the bank 105 so that the change δθ in the contact angle due to the inclination will be large at a high position on the circumferential surface 105c of the bank 105. As a result, the insufficient wetting with the ink drop 30 can be prevented. Here, the second-order derivative, which shows the change in the inclination angle (the first-order derivative) of the cross section of the circumferential surface 105c of the bank 105, is useful for expressing the change δθ in the contact angle. When the inflection point, at which the second-order derivative changes from 0 (i.e. the point at which the change δθ starts increasing), is located high on the circumferential surface 105c of the bank 105, the pinning point of the ink can be set near the inflection point. As a result, the insufficient wetting can be prevented.

The inventors verified the above concept as shown below, and designed the shape of the bank 105 that can effectively prevent the insufficient wetting in view of the results.

The following shows the details of the shape of the bank 105.

Test 1

The functional layer was manufactured in the following manner: ink manufactured by adding material of the functional layer into an organic solvent (Viscosity=3.8 mPa·s, Surface tension=33 mN/m) was sprayed by the inkjet method into the ink application area partitioned by the banks, was dried in vacuum with a pressure no greater than 10 Pa, and was baked on a plate at a temperature no lower than 180° C.

Figure 12:
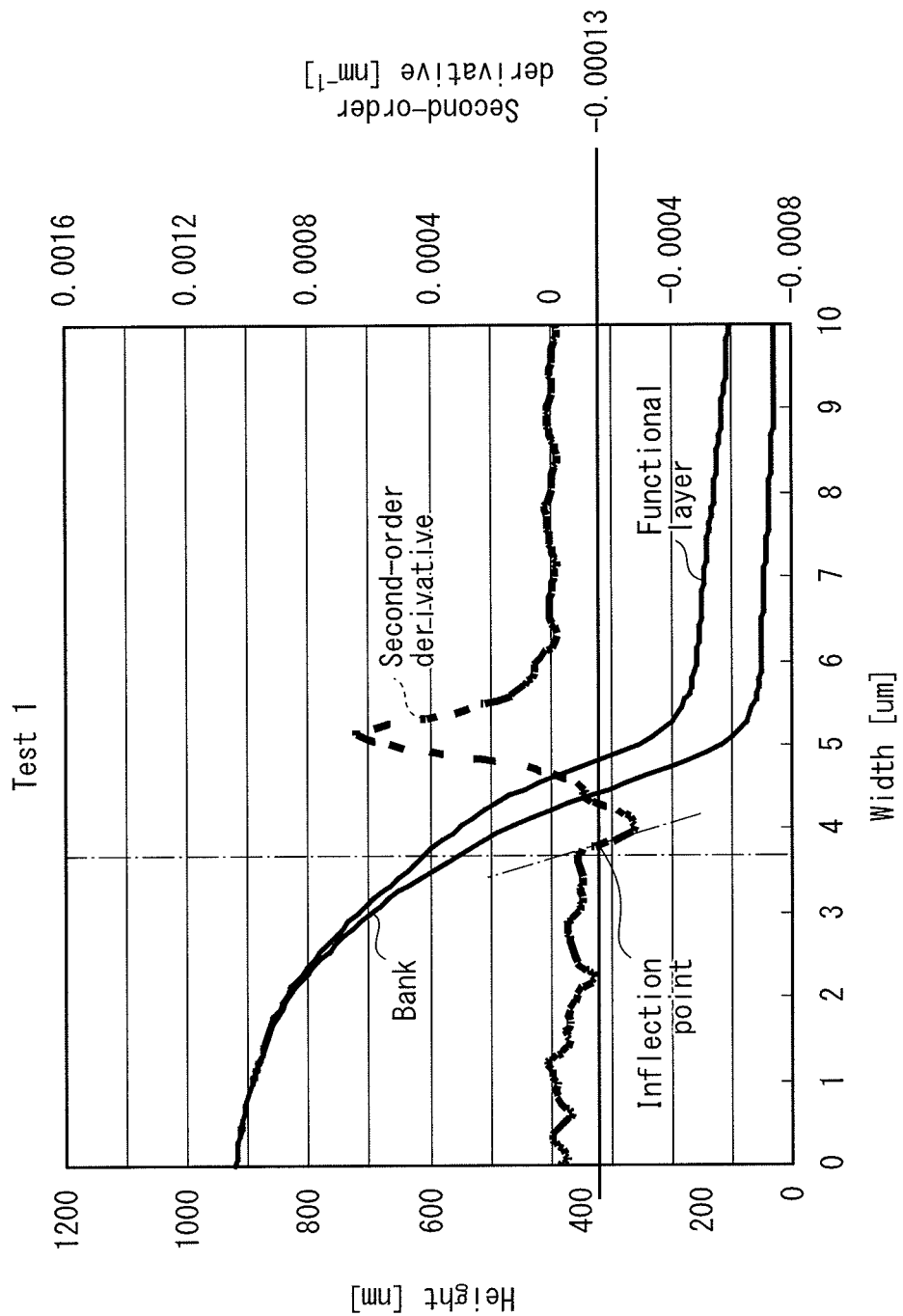
FIG. 12 shows cross-sectional shapes of a bank and a functional layer in Test 1.

FIG. 12 shows the cross-sectional taper profiles of the bank and the functional layer obtained by the above process, and the second-order derivative of the inclination thereof. Note that the cross-sectional taper profiles of the bank and the functional layer were measured by using an atomic force microscope (AFM).

In Test 1, the height h corresponding to the inflection point of the second-order derivative obtained for the cross-section of the bank was h=0.55 μm, which equals to 0.60h0, where the bank height h0 was h0=0.92 μm. The positional difference Δx between the inflection point and the pinning point in the major axis direction was 1.23 μm, and the positional difference Δy in the height direction was 0.22 μm. These differences are relatively large compared to the other test results. In this test, the second-order derivative falls more gently than the inclination of the circumferential surface of the bank. That is, the change δθ of the contact angle is small at a high point on the circumferential surface of the bank. It can be assumed that the pinning point control based on the shape of the circumferential surface of the bank could not be effectively performed, and the pinning occurred due to the evaporation accompanied with the recession in the CCA mode of the boundary between the upper surface of the functional layer and the circumferential surface of the bank. As a result, the pinning point was not formed on the circumferential surface of the bank and the insufficient wetting occurred in some cases.

Test 2

The functional layer was formed by the same process as Test 1.

Figure 13:
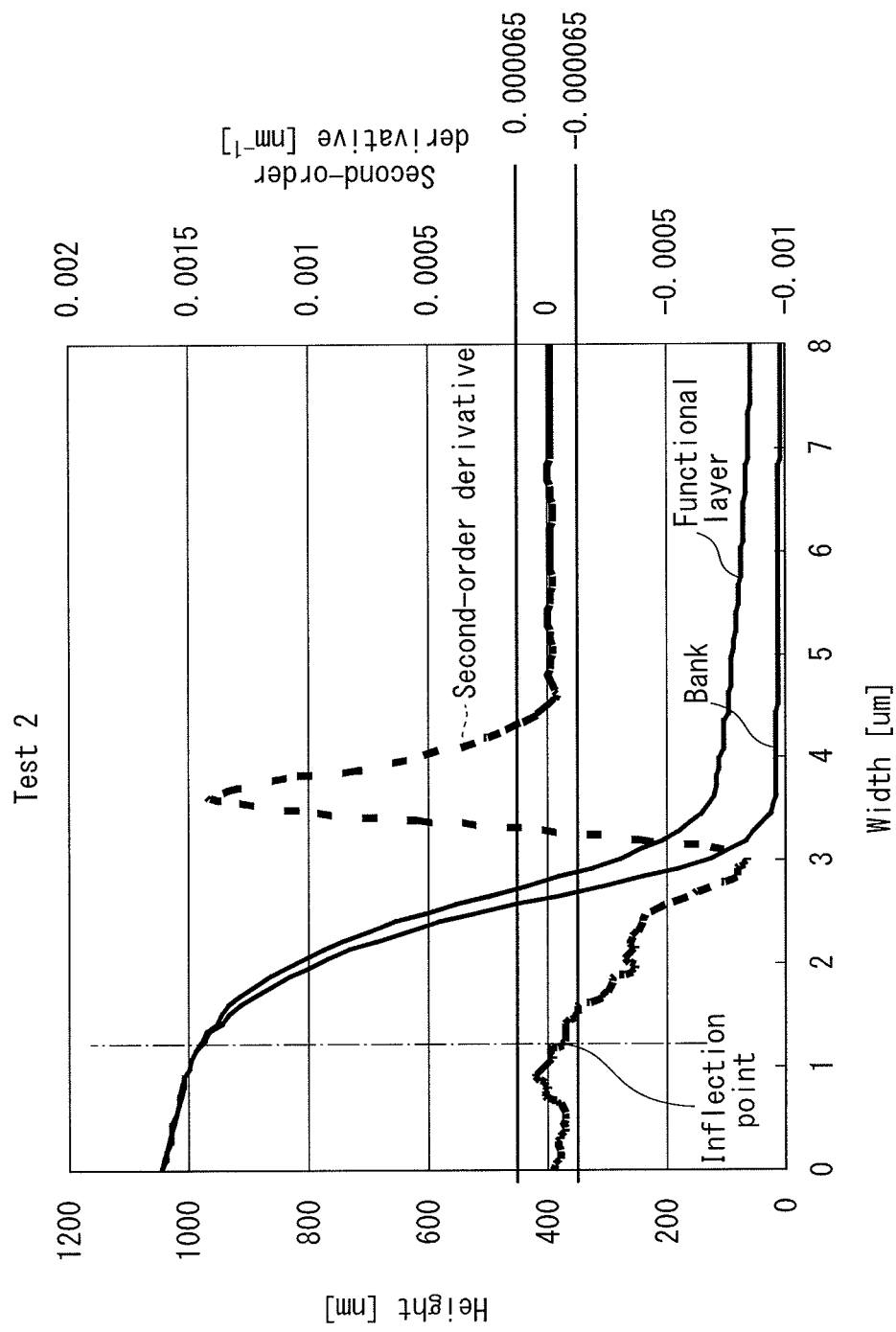
FIG. 13 shows cross-sectional shapes of a bank and a functional layer in Test 2.

FIG. 13 shows the cross-sectional taper profiles of the bank and the functional layer obtained by the above process, and the second-order derivative of the inclination thereof.

In Test 2, the height h corresponding to the inflection point of the second-order derivative obtained for the cross-section of the bank was h=0.99 μm, which equals to 0.93h0, where the bank height h0 was h0=1.06 μm. The positional difference Δx between the inflection point and the pinning point in the major axis direction was 0.44 μm, and the positional difference Δy in the height direction was 0.040 μm. In this test, the pinning point was formed near the inflection point on the circumferential surface of the bank, and the insufficient wetting did not occur.

Test 3

The functional layer was formed by the same process as Test 1.

Figure 14:
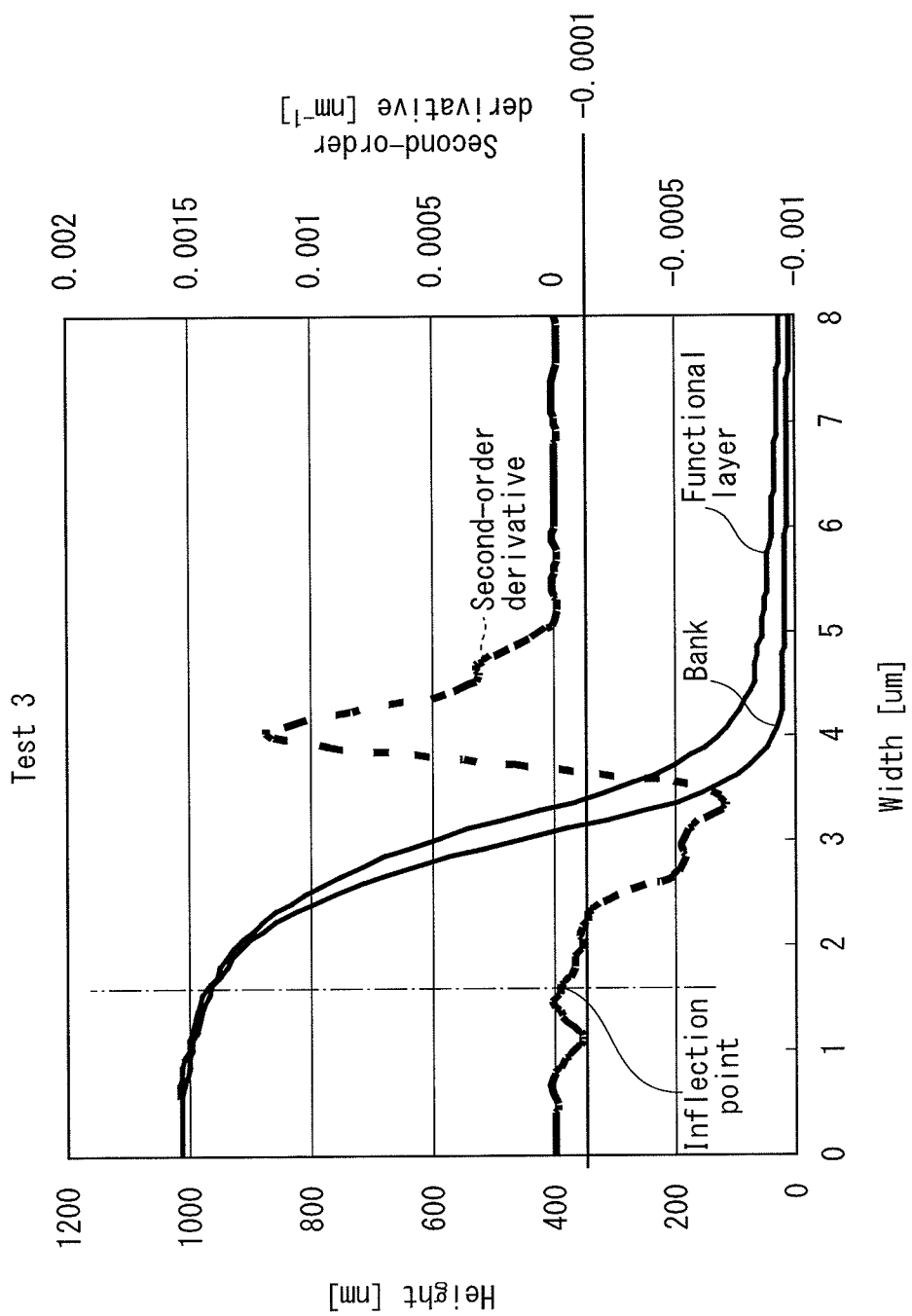
FIG. 14 shows cross-sectional shapes of a bank and a functional layer in Test 3.

FIG. 14 shows the cross-sectional taper profiles of the bank and the functional layer obtained by the above process, and the second-order derivative of the inclination thereof.

In Test 3, the height h corresponding to the inflection point of the second-order derivative obtained for the cross-section of the bank was h=0.99 μm, which equals to 0.98h0, where the bank height h0 was h0=1.01 μm. The positional difference Δx between the inflection point and the pinning point in the major axis direction was 0.26 μm, and the positional difference Δy in the height direction was 0.038 μm. In this test, the pinning point was formed near the inflection point on the circumferential surface of the bank, and the insufficient wetting did not occur.

Test 4

The functional layer was formed by the same process as Test 1.

Figure 15:
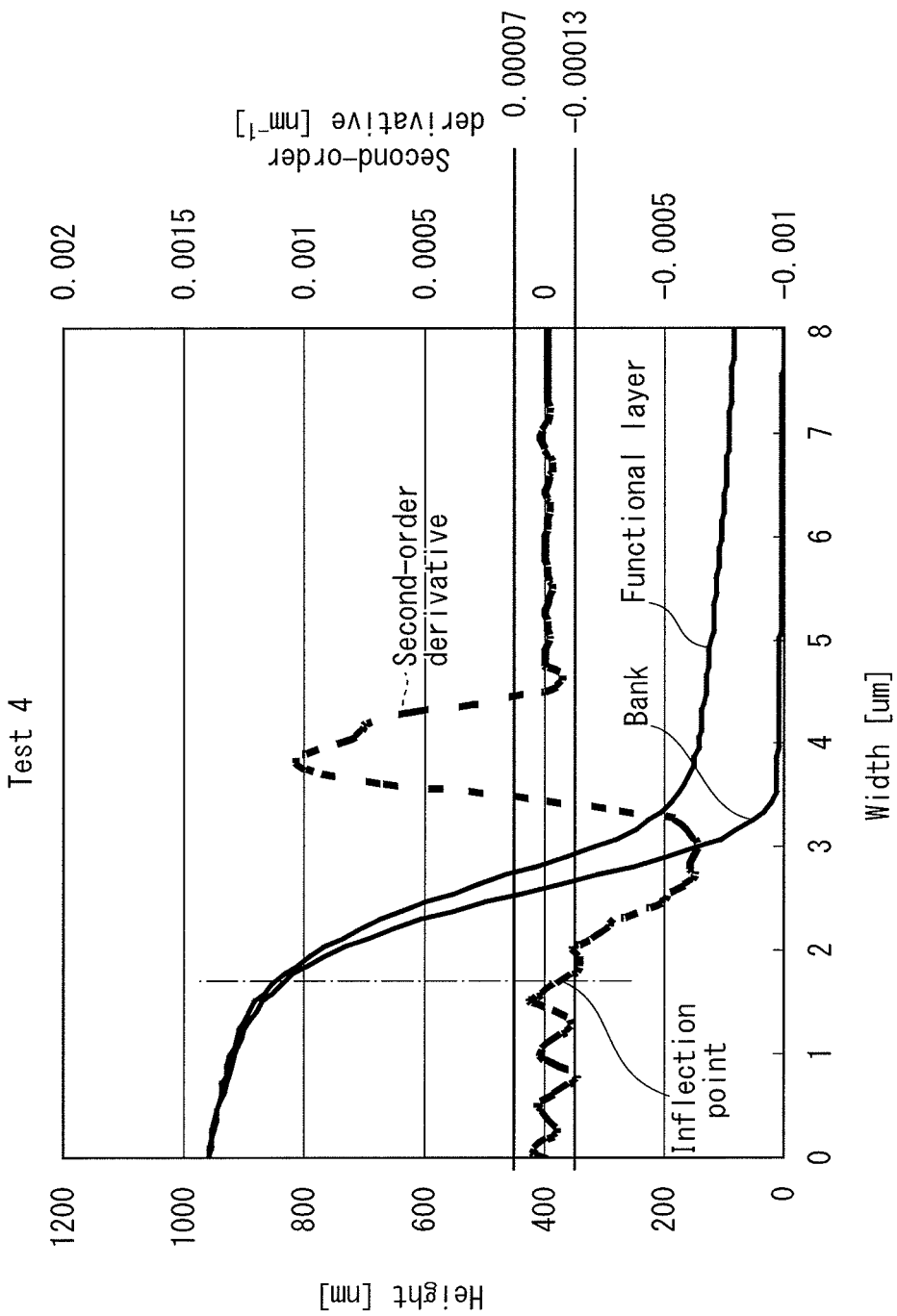
FIG. 15 shows cross-sectional shapes of a bank and a functional layer in Test 4.

FIG. 15 shows the cross-sectional taper profiles of the bank and the functional layer obtained by the above process, and the second-order derivative of the inclination thereof.

In Test 4, the height h corresponding to the inflection point of the second-order derivative obtained for the cross-section of the bank was h=0.88 μm, which equals to 0.90h0, where the bank height h0 was h0=0.98 μm. The positional difference Δx between the inflection point and the pinning point in the major axis direction was 0 μm, and the positional difference Δy in the height direction was 0 μm. In this test, the pinning point was stably formed near the inflection point on the circumferential surface of the bank, and the insufficient wetting did not occur.

Test 5

The functional layer was formed by the inkjet method in the following manner: Ink with hole injection material added (Viscosity=12.7 mPa·s, Surface tension=33 mN/m) was dried in vacuum with a pressure no greater than 10 Pa, and was baked on a plate at a temperature no lower than 220° C.

Figure 16:
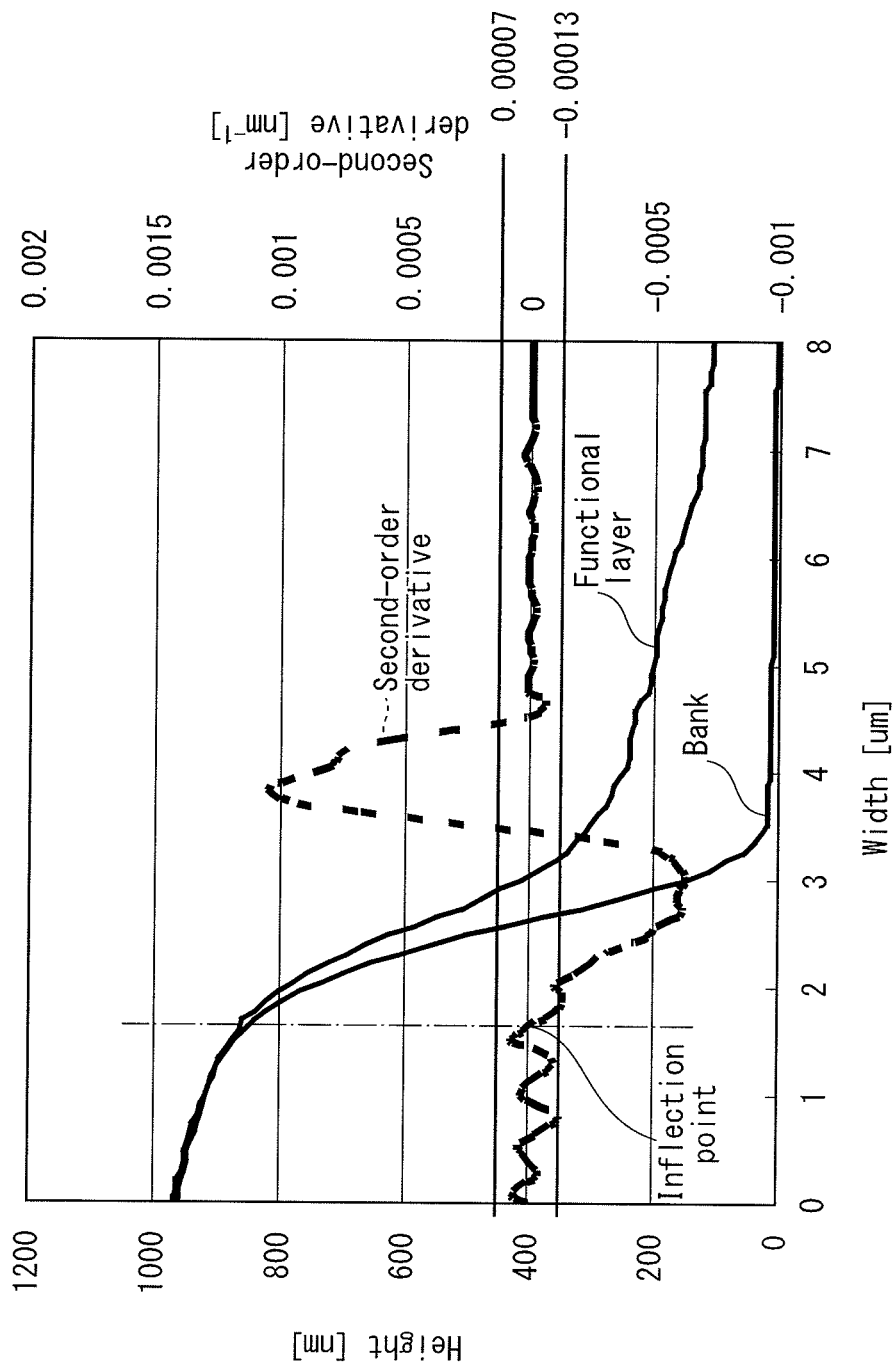
FIG. 16 shows cross-sectional shapes of a bank and a functional layer in Test 5.

FIG. 16 shows the cross-sectional taper profiles of the bank and the functional layer obtained by the above process, and the second-order derivative of the inclination thereof.

In Test 5, the height h corresponding to the inflection point of the second-order derivative obtained for the cross-section of the bank was h=0.88 µm, which equals to 0.90h0, where the bank height h0 was h0=0.98 µm. The positional difference Δx between the inflection point and the pinning point in the major axis direction was 0 µm, and the positional difference Δy in the height direction was 0 µm. In this test, the pinning point was stably formed near the inflection point on the circumferential surface of the bank, and the insufficient wetting did not occur.

FIG. 17 summarizes the above results. Considering the results shown in FIG. 17, the bank pertaining to the present disclosure was formed to have the cross-sectional shape shown in FIG. 11, for example. It is desirable that the shape of the bank defining the tapered aperture satisfies the following condition: when an upper surface of the bank is located at the height of h0 with reference to the top surface of the base layer and a given point on a circumferential surface that is continuous with the upper surface of the bank and that surrounds the aperture is located at the height h with reference to the top surface of the base layer, the height of the inflection point is equal to or greater than 0.9h0. Here, the inflection point is a point at which the second-order derivative of the height h with respect to the distance x changes from approximately 0 to a negative value. The distance x is measured from the boundary between the upper surface of the bank and the circumferential surface, in the major axis direction of the aperture.

The second-order derivative will be not continuous at the boundary between the upper surface of the bank and the circumferential surface when the inclination angle of the bank greatly changes at the boundary between the upper surface and the circumferential surface, instead of gradually changes from the upper surface to the circumferential surface, and forms an angular shape. That is, the tangent to the upper surface and the tangent to the circumferential surface greatly changes at the boundary between the upper surface and the circumferential surface. Such a shape is inappropriate, because it may cause structural failures such as disconnection caused by a step, cracks and the decrease in adhesiveness of the layers in the cathode and the passivation layer formed above the organic light-emitting layer, and leads to the degradation in quality of the organic EL apparatus.

Therefore, it is desirable that the second-order derivative with respect to the distance x from the boundary between the upper surface and the circumferential surface of the bank in the major axis direction is continuous at the boundary between the upper surface and the circumferential surface, and that, among one or more inflection points at which the second-order derivative changes to a negative value, the inflection point with a value of x closest to 0 is located at the height of 0.9h0 or greater.

When there are a plurality of inflection points, it is desirable that the height of the nearest inflection point to the upper surface of the bank is equal to or greater than 0.9h0 and less than 1.0h0. This is because the pinning point can be kept higher by keeping the second CCR mode than keeping the third or later CCR mode.

It should be noted here that the insufficient wetting did not occur in Test 1 even though the inflection point of the second-order derivative was 0.6h0. In this way, the insufficient wetting might not occur in some cases even if the inflection point of the second-order derivative is not optimum. In such cases, however, the pinning point cannot be set at the preferable location as shown in FIG. 11 and will be located at very low position, which increases the possibility of the insufficient wetting. It is very difficult to resolve this problem by using another technology, and hence the yield ratio will be very low in the end. In particular, since the conditions for applying the ink are now very strict due to recent miniaturization of pixels, it is very difficult to realize the desired yield ratio.

Figure 18:
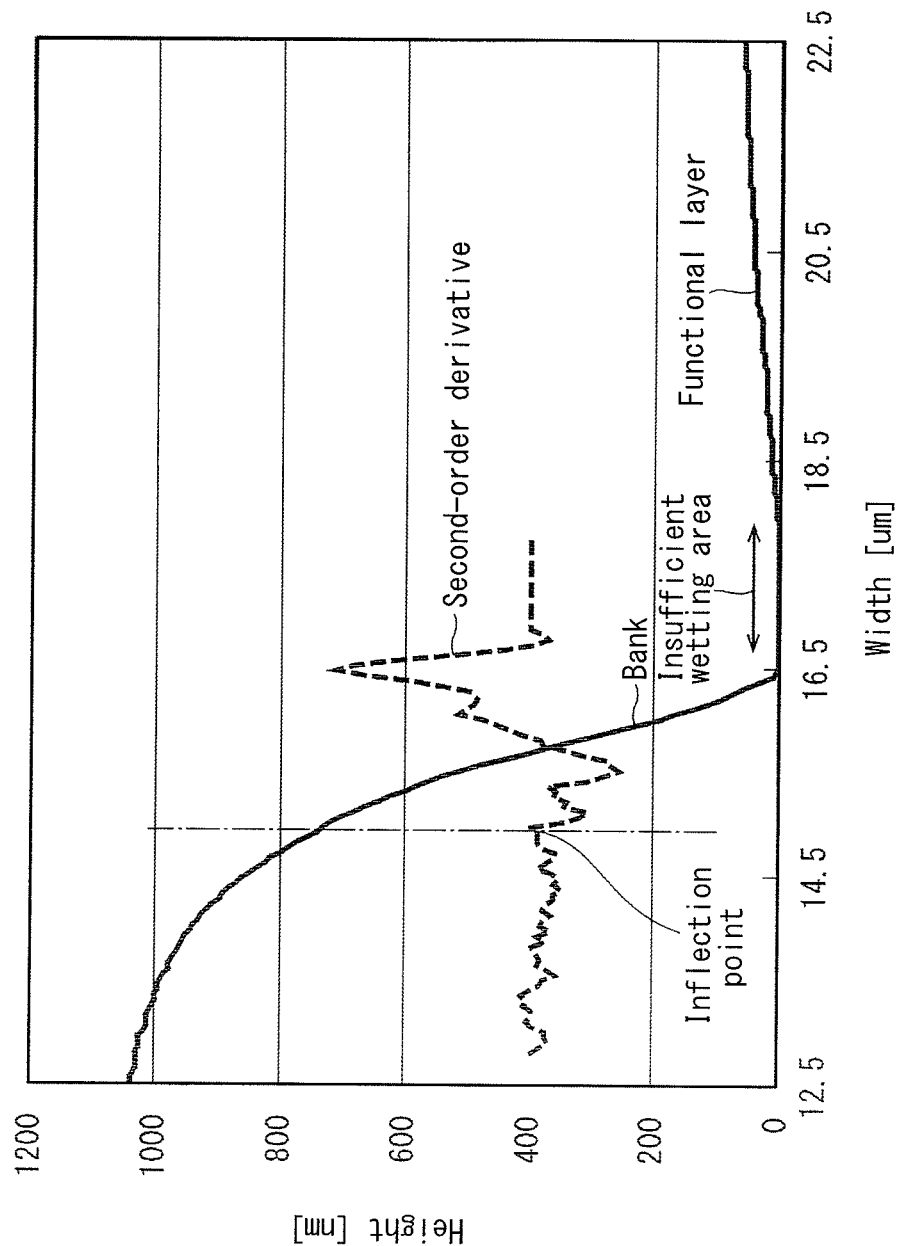
FIG. 18 shows cross-sectional shapes of a bank and a function layer when the insufficient wetting occurs.

FIG. 18 shows the cross-sectional taper profiles of the bank and the functional layer and the second-order derivative of the inclination thereof, with which the insufficient wetting occurred because the conditions were not satisfied. In the example shown in FIG. 18, the height h corresponding to the inflection point of the second-order derivative obtained for the cross-section of the bank is h=0.73 µm, and which equals to 0.68h0 where the height h0 of the bank is h0=1.08 µm. In this example, the pinning point was located on the top surface of the base layer instead of on the circumferential surface of the bank, and therefore the insufficient wetting occurred and the film was not formed properly.

The following are supplemental descriptions of the inflection point. Since the second-order derivative obtained from the test results varies more or less, it is necessary to some extent to accept variations of the inflection point obtained from the second-order derivative. More specifically, at the inflection point with the value of x that is "closest to 0", the second-order derivative varies within the range from $-6.5 \times 10^{-5}$ nm$^{-1}$ to $6.5 \times 10^{-5}$ nm$^{-1}$ in Test 2, within the range from $-1.0 \times 10^{-4}$ nm$^{-1}$ to $0$ nm$^{-1}$ in Test 3, within the range from $-1.3 \times 10^{-4}$ nm$^{-1}$ to $7.0 \times 10^{-5}$ nm$^{-1}$ in Test 4, and within the range from $-1.3 \times 10^{-4}$ nm$^{-1}$ to $7.0 \times 10^{-5}$ nm$^{-1}$ in Test 5. In other words, the width of the variation range is $1.3 \times 10^{-4}$ nm$^{-1}$ in Test 2, $1.0 \times 10^{-4}$ nm$^{-1}$ in Test 3, $2.0 \times 10^{-4}$ nm$^{-1}$ in Test 4, and $2.0 \times 10^{-4}$ nm$^{-1}$ in Test 5. Considering the above fact, the point at which the second-order derivative changes from approximately 0 to a negative value by no less than $1.0 \times 10^{-4}$ nm$^{-1}$ may be determined as the inflection point. The acceptable range may be set wider. For example, the point at which the second-order derivative changes by no less than $1.3 \times 10^{-4}$ nm$^{-1}$ may be determined as the inflection point. The acceptable range may be set further wider. For example, the point at which the second-order derivative changes by no less than $2.0 \times 10^{-4}$ nm$^{-1}$ may be determined as the inflection point.

Note that the banks used in the tests are made of a material containing mainly acrylic resin. The material mainly containing acrylic resin was used with different compositions. However, regardless of the composition of the material, the effect of keeping the pinning point high and preventing the insufficient wetting was achieved due to the inflection point located at the height of 0.9h0 or higher.

Ink having the viscosity of 3.8 mPa·s to 12.7 mPa·s was used for forming the functional layer. However, regardless of the viscosity of the ink, the effect of keeping the pinning point high and preventing the insufficient wetting was achieved due to the inflection point located at the height of 0.9h0 or higher.

Here, as can be seen from FIG. 17, it is desirable that the inflection point is located at or higher than 0.93h0. Here, as described above, the inflection point is the point at which the second-order derivative of the height of the circumferential surface with respect to the distance from one end of the upper surface along the major axis changes from 0 to a negative value.

It is also shown that in the samples not causing the insufficient wetting, the boundary between the upper surface of the functional layer and the circumferential surface of the bank is within the range of 40 nm from the inflection point in the height direction. This is because switching from the second CCR mode to the CCA mode did not occur and the inflection point was kept high, and therefore the pinning point was kept high.

Similarly, in the samples not causing the insufficient wetting, the boundary between the upper surface of the functional layer and the circumferential surface of the bank is within the range of 440 nm from the inflection point in the direction along the major axis. This is also because the switching from the second CCR mode to the CCA mode did not occur and the inflection point was kept high, and therefore the pinning point was kept high.

In the above cases, it is assumed that switching from the second CCR mode to the CCA mode does not occur before pinning occurs on the functional layer. However, the CCA mode does not necessarily occur twice before the pinning, and the number of the stages in the CCA mode is not limited to two or any other specific number. In other words, it is only necessary that the CCR mode occurs twice or more and the pinning of the inflection point occurs at a high location.

As described above, it is preferable that the second-order derivative is continuous at the boundary between the upper surface and the circumferential surface of the bank. In addition, it is preferable that the second-order derivative of the circumferential surface does not have discontinuity within the range from the boundary between the upper surface and the circumferential surface to the boundary between the base layer and the circumferential surface.

If the second-order derivative of the circumferential surface has discontinuity, it means the inclination angle of the circumferential surface greatly changes at the point (i.e. the circumferential surface is angular at the point). Depending on the angle at the point, the functional layer has a risk of disconnection caused by a step. In contrast, when the upper surface and the circumferential surface are connected to be smooth and the entire side surface is smooth, and furthermore, when the inflection point at which the second-order derivative changes from approximately 0 to a negative value is located at or higher than $0.9h_0$, the pinning point can be set high at a low risk of the disconnection caused by a step.

In the embodiment described above, the upper surface of the bank is partially parallel to the base layer as shown in the drawings, and the upper surface and the circumferential surface are depicted as different pieces. However, the upper surface of the bank is not necessarily parallel to the base layer, and the upper surface may be a single point. That is, for example, the top surface of the bank may be inclined with reference to the base layer, and the term "upper surface" may refer to the highest point on the bank.

The second electrode is disposed on the organic light-emitting layer so as to be in contact with the organic light-emitting layer. According to need, an electron transport layer or an electron injection layer maybe provided between the organic light-emitting layer and the second electrode. If this is the case, the second electrode is disposed so as to be in contact with the electron transport layer of the electron injection layer.

On the second electrode, a passivation film may be provided so as to prevent the degradation of the organic light-emitting layer due to water or oxygen.

Method of Manufacturing Organic EL Display Panel 10

The following describes an example manufacturing method of the organic EL display panel 10 according to Embodiment 1, with reference to FIG. 19A and FIGS. 20A through 20D. This manufacturing method is of course merely an example, and the organic EL display panel 10 can be manufactured by other known methods, except for the step of forming the banks.

Figure 19A:
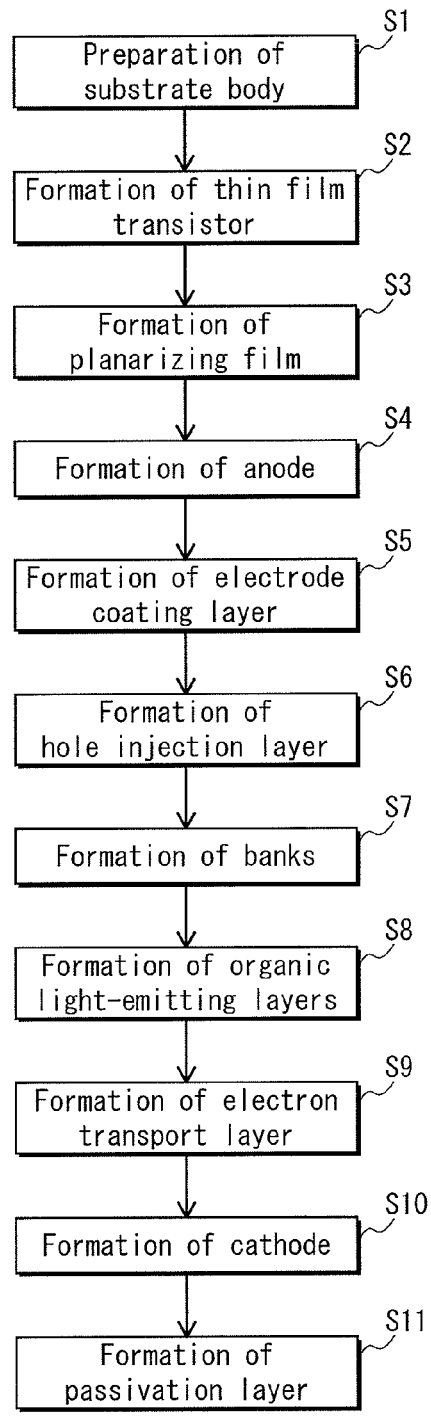
FIGS. 19A and 19B show processes of manufacturing an organic EL display panel.

First, a substrate body is prepared (Step S1 in FIG. 19A), and a wiring portion including a TFT (thin film transistor) is formed on the surface thereof (Step S2 in FIG. 19A). Then, a planarizing film is uniformly formed on the wiring portion while providing contact holes in the wiring portion so as to correspond in position to the gate/drain electrodes of the driving TFT in the wiring portion (Step S3 in FIG. 19A). Thus the substrate 101 completes.

Next, an anode 102 and a transparent conductive film (the electrode coating layer 103) are sequentially layered on the upper surface of the substrate 101 so as to correspond in position to the areas where the organic EL elements (light-emitters) 100R, 100B and 100G and the busbar area 100X are to be formed. On the busbar area 100X, the auxiliary electrode 102A and the electrode coating layer 103A are sequentially formed (Steps S4 and S5 in FIG. 19A and FIG. 20A). In this process, the anode 102 and the SD electrode of the wiring portion are electrically connected via the contact hole.

Next, the hole injection layer 104 is layered so as to cover the whole upper surface of the substrate 101 including the electrode coating layer 103 (Step S6 in FIG. 19A).

Here, the anode 102 is formed by first forming an Ag thin film by a sputtering method or a vacuum deposition method, for example, and then patterning the Ag thin film by a photolithography.

The electrode coating layers 103 are formed, for example, by forming a thin ITO film on the surface of the anodes 102 using a method such as the sputtering method and then patterning the thin ITO film via a method such as photolithography.

The hole-injection layer 104 is formed by first forming a metal film on the surface of the substrate 101 including the surface of the electrode coating layers 103 by sputtering method or the like. Subsequently, the metal film becomes oxidized, forming the hole injection transporting layer 104.

Next, as shown in FIG. 20B, the spin coat method, for example, is used to form a bank material layer 1050 so as to cover the top of the hole injection transporting layer 104. Photoresist material is used to form the bank material layer 1050. Specifically, as described above, an organic material having insulating properties such as ultraviolet curable resin, acrylic resin, polyimide resin, novolac-type phenolic resin, etc. can be used.

Next, a mask 501 is formed above the bank material layer 1050. The mask 501 has openings 502 corresponding in position to the area where the banks 105 are formed. Here, the width $D_0$ of the openings 502 is aligned with the width of the banks 105, and the width of the gaps between the banks 105 in the X direction (i.e. the widths of the light-emitting area and the busbar area in the X direction) is set to be $S_1$ or $S_2$.

Under such conditions, exposure process is performed by ultraviolet (UV) irradiation via the openings 502 of the mask 501. After that, the banks 105 are formed by a predetermined development process and baking process (Step S7 in FIG. 19A and FIG. 20C).

When inorganic material is used for forming the banks 105, the bank material layer 1050 can be formed by a coating method in the same manner as the case of using organic material. The patterning of the inorganic material is performed by a photo-etching method using a predetermined etchant (e.g. a solution of tetramethylammonium hydroxide (TMAH)).

The method of manufacturing the banks 105 will be describe later in detail.

Next, by a predetermined wet process, ink drops containing organic light-emitting material are dripped and applied into the ink application areas 101R, 101G and 101B in the apertures defined by the banks 105.

After application of the ink drops, the solvent is dried by baking or at the room temperature. Thus, the organic light-emitting layers 106R, 106G and 106B are appropriately formed (Step S8 in FIG. 19A).

Next, by a vacuum deposition method or the like, the electron transport layer 107 and the cathode 108 are sequentially formed over the upper surfaces of the organic light-emitting layers 106R, 106G and 106B and the surface 105a of the bank 105 (Step S9 and Step S10 in FIG. 19A and FIG. 20D).

Subsequently, the passivation layer 109 is formed on the upper surface of the cathode 108. Thus the organic EL display panel 10 completes (Step S11 in FIG. 19A).

Method of Manufacturing Banks 105

The banks 105 are formed by photolithography using acrylic resin-based material added with a photosensitizing agent and a liquid-repellency agent. When the banks 105 are formed by photolithography, the tapered shape of the apertures can be controlled by adjusting the exposure wavelength and the exposure amount, or performing secondary exposure (additional exposure) after the development. In this example, the exposure is performed by using the g-h-i lines (g line=436 nm, h line=405 nm, i line=365 nm) as the light source, and the exposure amount is adjusted within the range of 50 mJ to 500 mJ, in order to desired shape of the banks 105. The banks 105 having a height of 1 μm are formed through the following processes for development and baking.

After forming the banks 105, UV-$O_3$ treatment is applied on the surface 105a of the banks 105, and the liquid-repellency of the surface 105a of the banks 105 is controlled so that the contact angle falls within the range from 50° to 60° with respect to anisole.

Embodiment 2

Next, a method of manufacturing a TFT (a method of manufacturing a TFT substrate) as another aspect of the present invention is described with reference to FIG. 19B and FIGS. 21 through 23.

Manufacturing Method of TFT Substrate 101

Figure 19B:
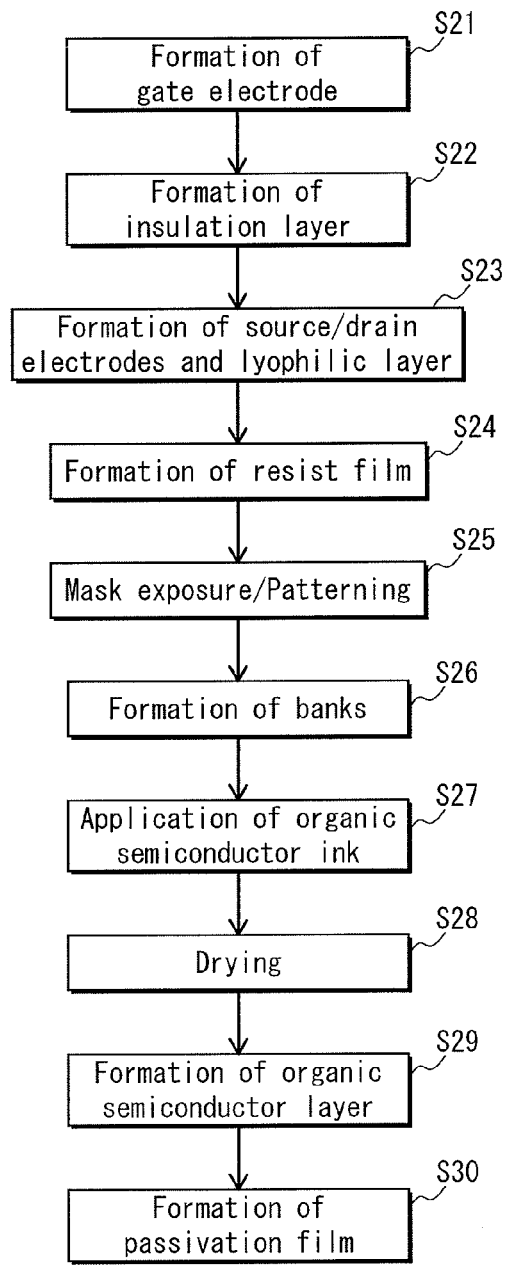
Figure 21A:
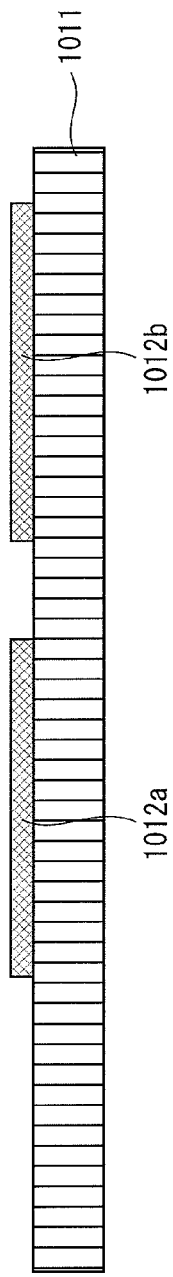
FIGS. 21A through 21C show processes of manufacturing a thin film transistor.

As shown in FIG. 21A, gate electrodes 1012a and 1012b are formed on the main surface of a substrate body 1011 (Step S21 in FIG. 19B). The gate electrodes 1012a and 1012b can be formed in the same manner as the anode 102 described above.

Figure 21B:
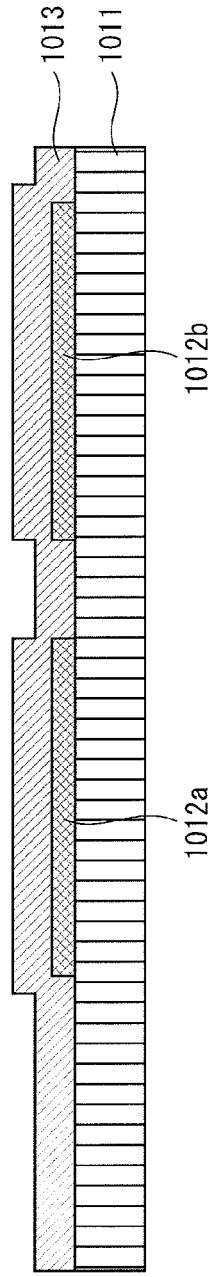

Next, as shown in FIG. 21B, an insulation layer 1013 is layered to cover the gate electrodes 1012a and 1012b and the upper surface of the substrate body 1011 (Step S22 in FIG. 19B).

Figure 21C:
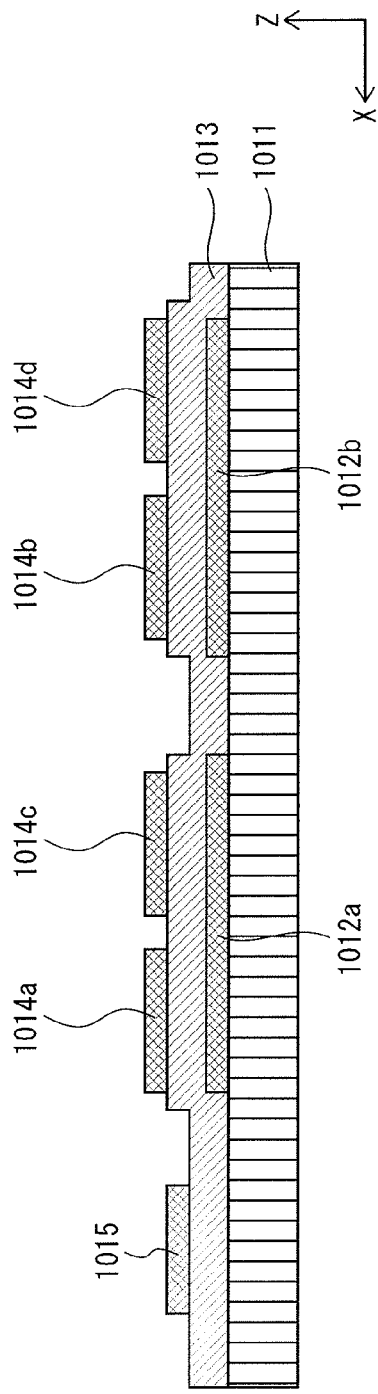

Next, as shown in FIG. 21C, source electrodes 1014a and 1014b, drain electrodes 1014c and 1014d and connection wiring 1015 are formed on the main surface of the insulation layer 1013 (Step S23 in FIG. 19B).

Figure 22A:
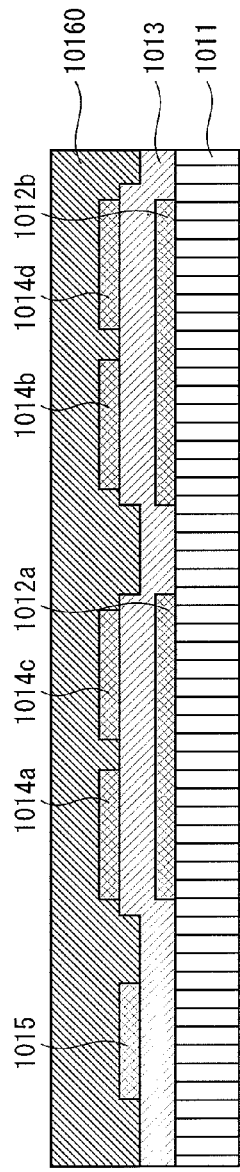
FIGS. 22A through 22C show processes of manufacturing a thin film transistor.

Next, as shown in FIG. 22A, a photoresist material film 10160 for forming banks 1016 is deposited to cover the source electrodes 1014a and 1014b, the drain electrodes 1014c and 1014d, the connection wiring 1015, and exposed portions 1013a and 1013b of the insulation layer 1013 (Step S24 in FIG. 19B).

Figure 22B:
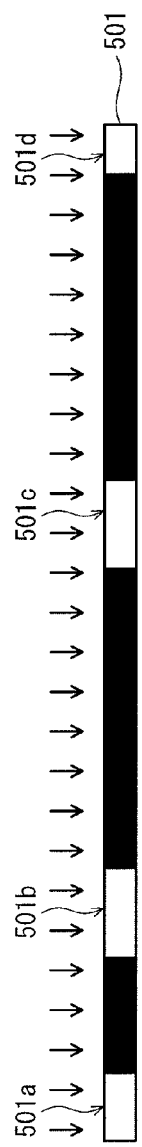

Then, as shown in FIG. 22B, by a photolithography method, a mask 501 is formed above the deposition of the photoresist material film 10160, and mask exposure and patterning is performed (Step S25 in FIG. 19B). Here, the mask 501 has windows 501a, 501b, 501c and 501d which correspond in position to the areas where the banks 1016 are to be formed. Note that although omitted from FIG. 22B, the mask 501 has other windows in addition to the windows 501a, 501b, 501c and 501d, which also correspond in position to the banks 1016.

Figure 22C:
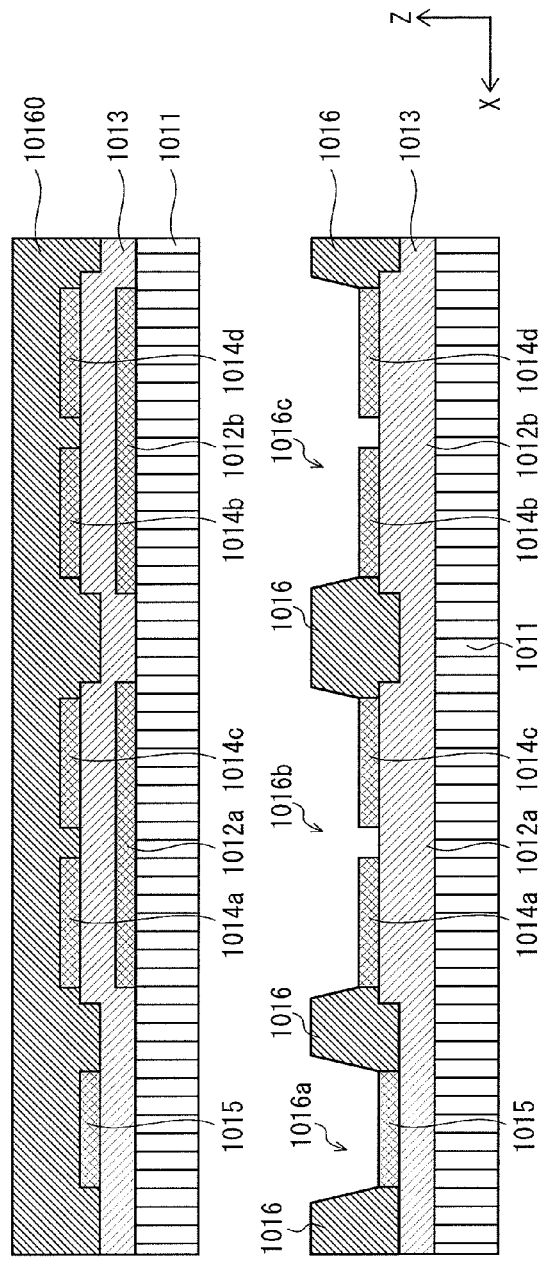

The banks 1016 shown in FIG. 22C can be thus formed (Step S26 in FIG. 19B). In the formation of the banks 1016, the tapered shape of the apertures can be controlled as described as for Embodiment 1 by adjusting the exposure wavelength and the exposure amount, or performing secondary exposure (additional exposure) after the development. In this embodiment, the desired shape of the banks 1016 is achieved by changing the conditions.

The banks 1016 define a plurality apertures, including apertures 1016a, 1016b and 1016c. The aperture 1016a surrounds connection wiring 1015, the aperture 1016b surrounds a source electrode 1014a and a drain electrode 1014c, and the aperture 1016c surrounds a source electrode 1014b and a drain electrode 1014d disposed on the bottom. In each of the apertures 1016b and 1016c, the source electrodes 1014a and 1014b and the drain electrodes 1014c and 1014d are disposed in a predetermined positional relationship.

Next, as shown in FIG. 23A, organic semiconductor ink drops 10170a and 10170b for forming organic semiconductor layers (semiconductor layers) 1017a and 1017b are dripped into ink application areas (apertures 1016b and 1016c) partitioned by the banks 1016 by using an ink application device (Step S27 in FIG. 19B).

Next, by drying the organic semiconductor ink drops 10170a and 10170b (Step S28 in FIG. 19B), the organic semiconductor layers 1017a and 1017b are formed in the apertures 1016b and 1016c respectively as shown in FIG. 23B (Step S29 in FIG. 19B).

Finally, as shown in FIG. 23B, a passivation film 1018 is formed so as to cover the whole surface except, for example, the contact area including the aperture 1016a (Step S30 in FIG. 19B). This completes the TFT substrate 101.

Although the TFT substrate 101 described above is an example of a transistor having a bottom gate structure, the transistor pertaining to the present embodiment may have a top gate structure.

Shape of Side Surface of Bank 1016

It is desirable that the shape of the side surface of the bank 1016 satisfies the following condition: when an upper surface of the bank 1016 is located at the height of h0 with reference to the top surface of the base layer (specifically, the upper surface of the source electrode 1014a or the drain electrode 1014c) and a point on a side surface that is continuous with the upper surface of the bank 1016 is located at the height h with reference to the top surface of the base layer, the height of the inflection point is equal to or greater than 0.9h0. Here, the inflection point is a point at which the second-order derivative of the height h with respect to the distance x changes from approximately 0 to a negative value. The distance x is measured from the boundary between the upper surface of the bank 1016 and the circumferential surface, in the major axis direction of the aperture.

With this structure, the pinning point can be set high on the functional layer, and the insufficient wetting of the functional layer can be prevented.

Therefore, it is desirable that the inflection point is located at the height of no less than 0.9h0 and less than 1.0h0. Here, as described above, the inflection point is the point at which the second-order derivative of the height of the circumferential surface with respect to the distance x changes from approximately 0 to a negative value, where the distance x is measured from the boundary of the upper surface and the circumferential surface of the bank, along the major axis of the aperture.

As described as for Embodiment 1, the second-order derivative will be not continuous at the boundary between the upper surface of the bank and the circumferential surface when the inclination angle of the bank 1016 greatly changes at the boundary between the upper surface and the side surface. Such a shape may cause structural failures such as disconnection caused by a step or formation of voids in the layers formed above the functional layer, and leads to the degradation in quality of the thin film transistor. Therefore, it is desirable that the second-order derivative is continuous at the boundary between the upper surface and the circumferential surface.

3. Other Matters

As a matter of course, in the case of applying the method of manufacturing the functional layer pertaining to the present disclosure to the manufacturing of the organic EL display panel, the method is applicable not only to manufacturing of the organic light-emitting layer but to manufacturing of other functional layers that can be manufactured through a wet process of applying a material. For example, the method can be applied to manufacturing of the hole injection layer 104 and the hole transport layer.

In the display panel 10, the anode 102 is located below the organic light-emitting layers 106R, 106G and 106B, and the cathode 108 is located above the organic light-emitting layers 106R, 106G and 106B. However, the present invention is not limited in this way. For example, the anode 102 and the cathode 108 may be interchanged in terms of their locations. In the case of realizing the top-emission type with the structure in which the anode 102 and the cathode 108 are interchanged, the cathode 108 needs to serve as a reflective electrode layer and the anode 102 needs to serve a transparent electrode layer.

In Embodiment 1, the organic light-emitting layers 106R, 106G and 106B correspond to luminescent colors of R, G and B, respectively. However, organic light-emitting layers for a color combination other than RGB or an organic light-emitting layer for a single color may be formed on the display panel.

In Embodiments 1 and 2 described above, the banks are used in display elements or transistors. However, the usage of the banks is not limited in this way. The banks may be used in lighting devices or other devices.

In Embodiment 1, the banks 105 have a pixel bank structure. However, the present invention is not limited in this way. The banks may have a line bank structure. Even when the line bank structure is adopted, the similar effect can be achieved by applying the present invention to the shape of both ends of each bank.

INDUSTRIAL APPLICABILITY

The light-emitters pertaining to the present disclosure are useful as lighting elements for a display of an electronic information terminal such as a personal computer and as lighting elements for a lighting apparatus.

REFERENCE SIGNS LIST

100: Organic EL element (Light-emitter)
101: Substrate
102: Anode (First electrode)
103: Electrode coating layer
104: Hole injection layer
105, 1016: Bank
106: Light-emitting layer (functional layer)
107: Electron transport layer
108: Cathode (Second electrode)
109: Passivation layer
110: Base layer
1011: Substrate
1012: Gate electrode
1013: Insulation layer
1014: Source electrode/Drain electrode
1017: Organic semiconductor layer (Semiconductor layer)

The invention claimed is:

1. A light-emitter comprising:
a base layer including a first electrode;
a bank defining an aperture on the base layer, the aperture having a major axis and a minor axis in plan view;
a functional layer located within the aperture and in contact with a top surface of the base layer; and
a second electrode corresponding in position to the first electrode with the functional layer interposed therebetween, wherein
in a cross-section passing through the major axis of the aperture in a perpendicular direction to the top surface of the base layer,
the bank has an upper surface located at a height of h0, with reference to the top surface of the base layer, and a circumferential surface facing the aperture,
when h denotes a height of a given point on the circumferential surface with reference to the top surface of the base layer, and x denotes a distance, measured in a direction along the top surface, of the given point from a boundary between the upper surface and the circumferential surface of the bank, a second-order derivative of h with respect to x is continuous at a point corresponding to the boundary, h being smaller than h0,
an inflection point of the second-order derivative, at which the second-order derivative changes from approximately 0 to a negative value, is located at a height of 0.9h0 or greater with reference to the top surface of the base layer, and
a top surface of the functional layer is in contact with the circumferential surface at a contact point near the inflection point.

2. The light-emitter of claim 1, wherein
the inflection point is located at a height of 0.93h0 or greater with reference to the top surface of the base layer.

3. The light-emitter of claim 1, wherein
in the cross-section passing through the major axis of the aperture in the perpendicular direction to the top surface of the base layer,
the contact point of the top surface of the functional layer and the circumferential surface is located below the inflection point, and a distance of the contact point from the inflection point in the perpendicular direction is no greater than 40 nm.

4. The light-emitter of claim 1, wherein
in the cross-section passing through the major axis of the aperture in the perpendicular direction to the top surface of the base layer,
the contact point of the upper surface of the functional layer and the circumferential surface is farther from the upper surface of the bank than the infection point is, and a distance of the contact point from the inflection point in a direction along the major axis of the aperture is no greater than 440 nm.

5. The light-emitter of claim 1, wherein
the functional layer is formed by a coating method.

6. The light-emitter of claim 1, wherein
the second-order derivative is continuous from the boundary between the upper surface and the circumferential surface of the bank to a boundary between the top surface of the base layer and the circumferential surface.

7. A transistor comprising:
a bank defining an aperture having a major axis and a minor axis in plan view;
a gate electrode located below or above the aperture;
a gate insulation film located closer to the aperture than the gate electrode is;
a base layer located below the bank and having a source electrode and a drain electrode, at least a portion of the source electrode and a portion of the drain electrode being located within the aperture; and
a semiconductor layer located within the aperture and in contact with the base layer, the semiconductor layer corresponding in position to the gate electrode with the gate insulation film interposed therebetween wherein
in a cross-section passing through the major axis of the aperture in a perpendicular direction to the top surface of the base layer,
the bank has an upper surface located at a height of $h0$ with reference to the top surface of the base layer, and a circumferential surface facing the aperture,
when $h$ denotes a height of a given point on the circumferential surface with reference to the top surface of the base layer, and $x$ denotes a distance, measured in a direction along the top surface, of the given point from a boundary between the upper surface and the circumferential surface of the bank, a second-order derivative of $h$ with respect to $x$ is continuous at a point corresponding to the boundary, $h$ being smaller than $h0$,
an inflection point of the second-order derivative, at which the second-order derivative changes from approximately 0 to a negative value, is located at a height of $0.9h0$ or greater with reference to the top surface of the base layer, and
a top surface of the functional layer is in contact with the circumferential surface at a contact point near the inflection point.

8. The transistor of claim 7, wherein
the inflection point is located at a height of $0.93h0$ or greater with reference to the top surface of the base layer.

9. The transistor of claim 7, wherein
in the cross-section passing through the major axis of the aperture in the perpendicular direction to the top surface of the base layer,
the contact point of the top surface of the functional layer and the circumferential surface is located below the inflection point, and a distance of the contact point from the inflection point in the perpendicular direction is no greater than 40 nm.

10. The transistor of claim 7, wherein
in the cross-section passing through the major axis of the aperture in the perpendicular direction to the top surface of the base layer,
the contact point of the upper surface of the functional layer and the circumferential surface is farther from the upper surface of the bank than the infection point is, and a distance of the contact point from the inflection point in a direction along the major axis of the aperture is no greater than 440 nm.

11. The transistor of claim 7, wherein
the functional layer is formed by a coating method.

12. The transistor of claim 7, wherein
the second-order derivative is continuous from the boundary between the upper surface and the circumferential surface of the bank to a boundary between the top surface of the base layer and the circumferential surface.

* * * * *